United States Patent
Yamada

(12) 
(10) Patent No.: US 6,846,695 B2
(45) Date of Patent: Jan. 25, 2005

(54) SOLID STATE IMAGING DEVICE AND METHOD FOR MANUFACTURING THE SAME

(75) Inventor: Tooru Yamada, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/377,314

(22) Filed: Feb. 27, 2003

(65) Prior Publication Data

US 2004/0259293 A1 Dec. 23, 2004

(30) Foreign Application Priority Data

Mar. 1, 2002 (JP) ........................................ 2002-056030

(51) Int. Cl.[7] .............................................. H01L 21/00
(52) U.S. Cl. ........................... 438/73; 438/75; 257/443; 257/448
(58) Field of Search .................... 438/73, 75; 257/443, 257/448

(56) References Cited

U.S. PATENT DOCUMENTS

| | | | | |
|---|---|---|---|---|
| 5,742,081 A | * | 4/1998 | Furumiya | 257/232 |
| 5,912,482 A | | 6/1999 | Morimoto | |
| 6,111,279 A | * | 8/2000 | Nakashiba | 257/222 |
| 6,194,242 B1 | * | 2/2001 | Uchiya | 438/48 |
| 6,472,255 B1 | * | 10/2002 | Hatano et al. | 438/144 |

FOREIGN PATENT DOCUMENTS

JP 11-26749 1/1999

* cited by examiner

Primary Examiner—Trung Dang
(74) Attorney, Agent, or Firm—Merchant & Gould P.C.

(57) ABSTRACT

A solid-state imaging device of the present invention includes a vertical charge transfer portion and a horizontal charge transfer portion that is connected to at least one end of the vertical charge transfer portion. The vertical charge transfer portion includes a vertical transfer channel region and a plurality of vertical transfer electrodes formed on the vertical transfer channel region. The horizontal charge transfer portion includes a horizontal transfer channel region, a plurality of first horizontal transfer electrodes formed on the horizontal transfer channel region, and a plurality of second horizontal transfer electrodes arranged between the plurality of first horizontal transfer electrodes. A potential below the first horizontal transfer electrode is higher than a potential below the second horizontal transfer electrode that is arranged adjacent to the first horizontal transfer electrode and backward along a transfer direction with respect to the first horizontal transfer electrode. In the solid-state imaging device of the present invention, in a connection portion of the vertical charge transfer portion and the horizontal charge transfer portion, a distance between a final vertical transfer electrode arranged at a terminating end of the vertical charge transfer portion and the first horizontal transfer electrode in the horizontal charge transfer portion is equal to or smaller than a distance between the first horizontal transfer electrodes in the horizontal charge transfer portion.

16 Claims, 24 Drawing Sheets

SOLID STATE IMAGING DEVICE AND METHOD FOR MANUFACTURING THE SAME

BACKGROUND OF THE INVENTION

1. Field of the Invention

The present invention relates to a solid-state imaging device including a plurality of vertical charge transfer portions and a horizontal charge transfer portion that is connected to one end or both ends of the vertical charge transfer portions.

2. Description of Related Art

An interline transfer solid-state imaging device includes a plurality of photoelectric conversion portions that are arranged in a matrix, plural rows of vertical charge transfer portions that are arranged in correspondence with respective rows of the photoelectric conversion portions, a horizontal charge transfer portion that is connected electrically to one end of each of the vertical charge transfer portions and an output circuit portion that is connected to one end of the horizontal charge transfer portion. In such a solid-state imaging device, signal charges generated in the photoelectric conversion portions are transferred vertically by the vertical charge transfer portions to the horizontal charge transfer portion, transferred horizontally (in a direction perpendicular to the transfer direction in the vertical charge transfer portions) by this horizontal charge transfer portion, and then reach the output circuit portion.

FIGS. 21 to 23 are schematic views showing a structure in the vicinity of a connection portion of a vertical charge transfer portion and a horizontal charge transfer portion in a conventional interline transfer solid-state imaging device, with FIG. 21 being a plan view, FIG. 22 being a sectional view taken along line A-A' in FIG. 21, and FIG. 23 being a sectional view taken along line B-B' in FIG. 21. In these figures, numeral 401 denotes a vertical charge transfer portion, numeral 416 denotes a connection portion of the vertical charge transfer portion and a horizontal charge transfer portion, numeral 403 denotes the horizontal charge transfer portion, numeral 405 denotes an N$^{---}$-type semiconductor substrate, numeral 406 denotes a P-type well layer, numeral 407 denotes a P$^{+}$-type element isolation region, numeral 408 denotes an N-type semiconductor region, numerals 409a, 409b and 409c denote N$^{-}$-type semiconductor regions, numeral 410 denotes an insulating film, numerals 411, 412a, 412b and 413 denote vertical transfer electrodes, numerals 414a and 414b denote first horizontal transfer electrodes, and numerals 415a and 415b denote second horizontal transfer electrodes.

The vertical charge transfer portion 401 includes the N$^{---}$-type semiconductor substrate 405, the P-type well layer 406 formed on the surface of the N$^{---}$type semiconductor substrate 405, and the N-type semiconductor region 408 serving as a vertical transfer channel region formed on the surface of the P-type well layer 406. On this N-type semiconductor region 408, a plurality of the vertical transfer electrodes 411, 412a, 412b and 413 are formed via the insulating film 410. Each of the vertical transfer electrodes is wired so as to be supplied with a clock pulse φV1, φV2, φV3 or φV4.

In the horizontal charge transfer portion 403, the N-type semiconductor region 408 serving as a horizontal transfer channel region is formed on the surface of the above-mentioned P-type well layer 406. On this N-type semiconductor region 408, a plurality of the first horizontal transfer electrodes 414a and 414b are formed via the insulating film 410. Further, a space between the first horizontal transfer electrodes is provided with the N-type semiconductor region 409a, on which the second horizontal transfer electrodes 415a and 415b are formed via the insulating film 410. Each of the horizontal transfer electrodes is wired so as to be supplied with a clock pulse φH1 or φH2.

Also, in the connection portion 416 of the vertical charge transfer portion and the horizontal charge transfer portion, the vertical transfer electrode 413 that is arranged at the terminating end of the vertical charge transfer portion 401 (in the following, referred to as "the final vertical transfer electrode") and the first horizontal transfer electrode 414a are arranged so as to have a space therebetween, where the N-type semiconductor region 409b is formed. In addition, the second horizontal transfer electrode 415a covers this N-type semiconductor region 409b.

Next, a charge transfer operation from the vertical charge transfer portion to the horizontal charge transfer portion in the above-described solid-state imaging device will be explained referring to FIGS. 24 to 26. FIG. 26 illustrates an example of a dock pulse to be applied to each of the transfer electrodes in the vertical charge transfer portion and the horizontal charge transfer portion. FIGS. 24 and 25 show a potential distribution during charge transfer from the vertical charge transfer portion to the horizontal charge transfer portion when being driven by the dock pulse shown in FIG. 26, with FIG. 24 showing the potential in the vicinity of the connection portion of the vertical charge transfer portion and the horizontal charge transfer portion and FIG. 25 showing that in the horizontal charge transfer portion. In these figures, a downward arrow indicates a positive direction of the potential, and the charge is stored in a diagonally shaded area (the same will apply to the following description).

At time t1, a signal charge 417 in the vertical charge transfer portion 401 is accumulated below the vertical transfer electrodes 411 and 412b that are supplied with a high voltage $V_{VH}$. Then, at time t2, the pulse φV4 changes from $V_{HL}$ to $V_{HH}$ and the pulse φV2 changes from $V_{HH}$ to $V_{HL}$, whereby a part of the signal charge 417 begins to be transferred from the vertical charge transfer portion 401 to the horizontal charge transfer portion 403. Next, at time t3, the pulse φV1 changes from $V_{HL}$ to $V_{HH}$ and the pulse φV3 changes from $V_{HH}$ to $V_{HL}$, whereby the signal charge 417 further is transferred from the vertical charge transfer portion 401 to the horizontal charge transfer portion 403. At time t4, the pulse φV2 changes from $V_{HL}$ to $V_{HH}$ and the pulse φV4 changes from $V_{HH}$ to $V_{HL}$, whereby the transfer operation of the signal charge 417 from the vertical charge transfer portion 401 to the horizontal charge transfer portion 403 ends. At this time, the signal charge 417 is accumulated below the first horizontal transfer electrode 414a that is supplied with $V_{HH}$ in the horizontal charge transfer portion 403. The next signal charge 418 already is transferred to the portion below the vertical transfer electrodes 411 and 412a that are supplied with the high voltage $V_{HH}$. At time t5, the pulse φV3 changes from $V_{HL}$ to $V_{HH}$ and the pulse φV1 changes from $V_{HH}$ to $V_{HL}$, whereby the next signal charge 418 is transferred to the portion below the vertical transfer electrodes 411 and 412b that are supplied with the high voltage $V_{V-H}$.

Thereafter, the horizontal charge transfer portion is activated, and at time t6, φH1 changes from $V_{HH}$ to $V_{HL}$ and φH2 changes from $V_{HL}$ to $V_{HH}$, whereby the signal charge 417 that has been stored below the first horizontal transfer electrode 414a is now stored below the first horizontal transfer electrode 414b. Furthermore, at time t7, φH1 changes from $V_{HL}$ to $V_{HH}$ and φH2 changes from $V_{HH}$ to $V_{HL}$, whereby the signal charge 417 that has been stored below the first horizontal transfer electrode 414b is now stored below the first horizontal transfer electrode 414a that is arranged further forward. By repeating this operation, the signal charges are transferred through the horizontal charge transfer portion.

As shown in FIG. 25, during the operation of the above-described solid-state imaging device, a potential barrier 419 is formed below the N⁻-type semiconductor region 409a in the horizontal charge transfer-portion. This potential barrier 419 suppresses a backward transfer of the charges in the horizontal charge transfer portion. Further, as shown in FIG. 24, a potential barrier 420 is formed below the N⁻-type semiconductor region 409b in the connection portion 416 of the vertical charge transfer portion and the horizontal charge transfer portion. This potential barrier 420 suppresses a backward transfer of the charges from the horizontal charge transfer portion to the vertical charge transfer portion.

However, as pixels become finer and the horizontal charge transfer portion is driven at a lower voltage in the conventional solid-state imaging device as described above, it becomes more difficult to transfer charges smoothly from the vertical charge transfer portion to the horizontal charge transfer portion. This leads to problems of a vertical line display abnormality, so-called black line defect, and a considerable drop of the transfer efficiency. Referring to FIGS. 21, 24 and 25, the cause of such problems will be explained in the following.

In the conventional solid-state imaging device, since finer pixels accompany a narrower repetition pitch of the horizontal charge transfer portion 403, it has been necessary to narrow the distance ($L_{HBA}$) between the first horizontal transfer electrode 414a and the first horizontal transfer electrode 415a. On the other hand, the distance ($L_{V-H}$) between the final vertical transfer electrode 413 and the first horizontal transfer electrode 414a of the horizontal charge transfer portion 403 can be designed irrespective of the finer pixels. Accordingly, as shown in FIG. 21, the conventional solid-state imaging device has been designed so that, as the pixels become finer, the distance ($L_{V-H}$) between the final vertical transfer electrode 413 and the first horizontal transfer electrode 414a in the connection portion 416 is longer than the distance ($L_{HBA}$) between the first horizontal transfer electrodes in the horizontal charge transfer portion. As a result, a short channel effect in the N⁻-type semiconductor region 409a in the horizontal charge transfer portion is larger than that in the N⁻-type semiconductor region 409b in the connection portion. Accordingly, as shown in FIGS. 24 and 25, the potential barrier 420 in the connection portion of the vertical charge transfer portion and the horizontal charge transfer portion is larger than the potential barrier 419 in the horizontal charge transfer portion. Therefore, even when the high voltage of the clock pulses φH1 and φH2 to be applied to the horizontal charge transfer portion 403 is set so that no transfer defect is generated in the horizontal charge transfer portion 403, a transfer hindrance 421 causes a transfer residue 422 of the signal charge in the charge transfer from the vertical charge transfer portion 401 to the horizontal charge transfer portion 403 at time t2 and time t3. This sometimes has caused a vertical line display abnormality, so-called black line defect. In other words, as the voltage of the clock pulses φH1 and φH2 to be applied to the horizontal charge transfer portion 403 is lowered, the transfer defect occurs in the connection portion of the vertical charge transfer portion and the horizontal charge transfer portion earlier than in the horizontal charge transfer portion 403 itself. Thus, it has been difficult to drive the horizontal charge transfer portion 403 at a lower voltage.

SUMMARY OF THE INVENTION

A solid-state imaging device according to the present invention includes a vertical charge transfer portion including a vertical transfer channel region, and a plurality of vertical transfer electrodes formed on the vertical transfer channel region; and a horizontal charge transfer portion that is connected to at least one end of the vertical charge transfer portion and receives a charge transferred from the vertical charge transfer portion and then transfers the charge. The horizontal charge transfer portion includes a horizontal transfer channel region, a plurality of first horizontal transfer electrodes formed on the horizontal transfer channel region, and a plurality of second horizontal transfer electrodes arranged between the plurality of first horizontal transfer electrodes. A potential below the first horizontal transfer electrode is higher than a potential below the second horizontal transfer electrode that is arranged adjacent to the first horizontal transfer electrode and backward along a transfer direction with respect to the first horizontal transfer electrode. In a connection portion of the vertical charge transfer portion and the horizontal charge transfer portion, a final vertical transfer electrode arranged at a terminating end of the vertical charge transfer portion and the first horizontal transfer electrode in the horizontal charge transfer portion are arranged so as to have a space therebetween where the second horizontal transfer electrode is arranged. A distance between the final vertical transfer electrode and the first horizontal transfer electrode in the connection portion is equal to or smaller than a distance between the first horizontal transfer electrodes in the horizontal charge transfer portion.

Further, a method of the present invention for manufacturing a solid-state imaging device, which includes a vertical charge transfer portion and a horizontal charge transfer portion that is connected to at least one end of the vertical charge transfer portion and receives a charge transferred from the vertical charge transfer portion and then transfers the charge, includes forming a vertical transfer channel region and a horizontal transfer channel region in a semiconductor substrate, forming a plurality of first vertical transfer electrodes and a final vertical transfer electrode arranged at a terminating end of the vertical charge transfer portion on the vertical transfer channel region, and forming a plurality of first horizontal transfer electrodes on the horizontal transfer channel region, and forming a plurality of second vertical transfer electrodes on the vertical transfer channel region so as to be arranged between the plurality of first vertical transfer electrodes, thus forming the vertical charge transfer portion, and forming a plurality of second horizontal transfer electrodes on the horizontal transfer channel region so as to be arranged between the plurality of first horizontal transfer electrodes, thus forming the horizontal charge transfer portion. In a region to be a connection portion of the vertical charge transfer portion and the horizontal charge transfer portion, the final vertical transfer electrode and the first horizontal transfer electrode are formed so as to be spaced away from each other, and the second horizontal transfer electrode is formed so that a part of the second horizontal transfer electrode is arranged between the final vertical transfer electrode and the first horizontal transfer electrode. A distance between the final vertical transfer electrode and the first horizontal transfer electrode in the region to be the connection portion is made equal to or smaller than a distance between the first horizontal transfer electrodes in the horizontal charge transfer portion.

DESCRIPTION OF THE PREFERRED EMBODIMENTS

Figure 1:
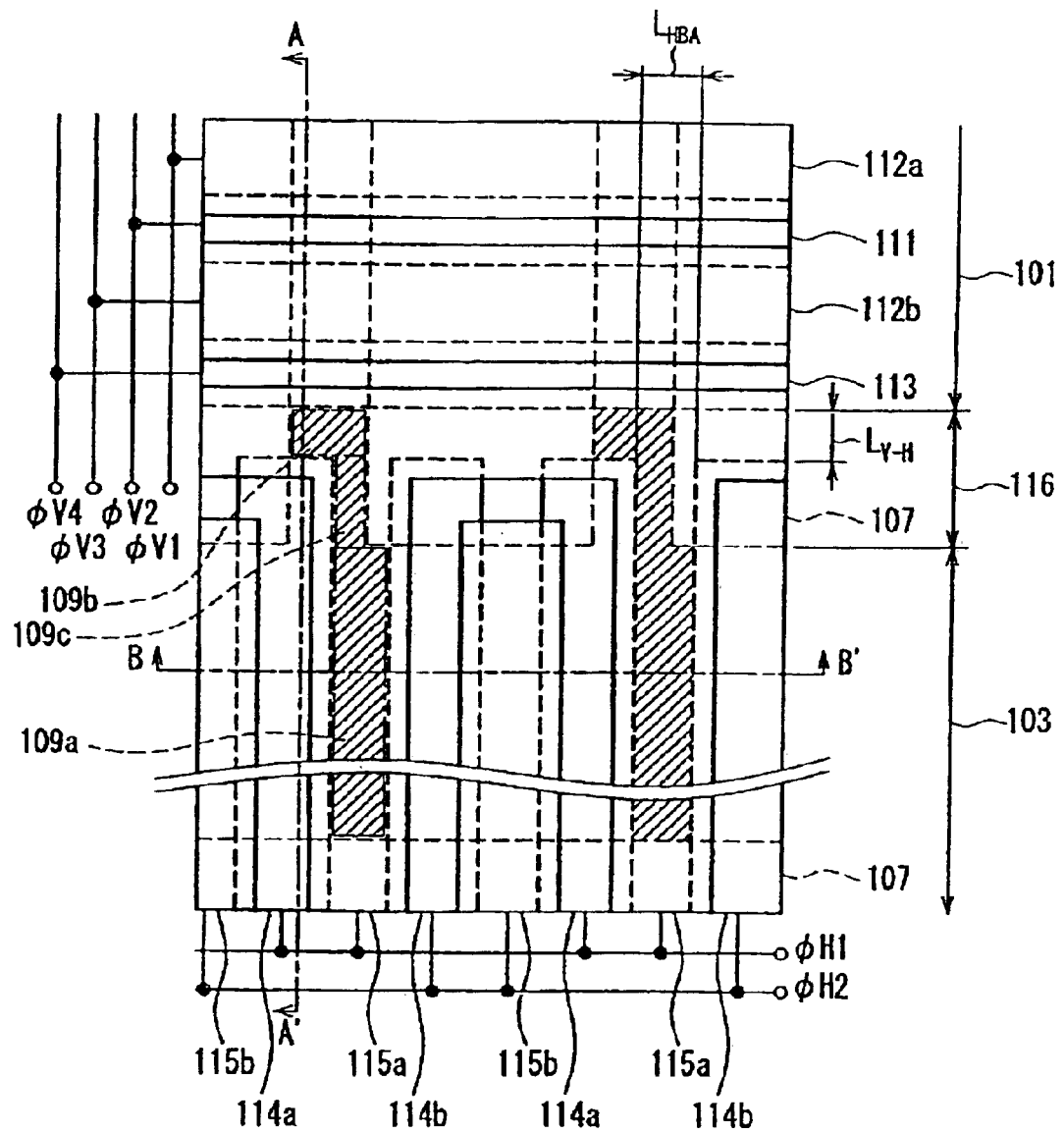
FIG. 1 is a plan view showing an example of a structure of a solid-state imaging device according to a first embodiment of the present invention.

As described above, a solid-state imaging device according to the present invention includes a vertical charge transfer portion including a vertical transfer channel region, and a plurality of vertical transfer electrodes formed on the vertical transfer channel region; and a horizontal charge transfer portion that is connected to at least one end of the vertical charge transfer portion and receives a charge transferred from the vertical charge transfer portion and then transfers the charge. The horizontal charge transfer portion includes a horizontal transfer channel region, a plurality of first horizontal transfer electrodes formed on the horizontal transfer channel region, and a plurality of second horizontal transfer electrodes arranged between the plurality of first horizontal transfer electrodes. A potential below the first horizontal transfer electrode is higher than a potential below the second horizontal transfer electrode that is arranged adjacent to the first horizontal transfer electrode and backward along a transfer direction with respect to the first horizontal transfer electrode. In a connection portion of the vertical charge transfer portion and the horizontal charge transfer portion, a final vertical transfer electrode arranged at a terminating end of the vertical charge transfer portion and the first horizontal transfer electrode in the horizontal charge transfer portion are arranged so as to have a space therebetween where the second horizontal transfer electrode is arranged. A distance between the final vertical transfer electrode and the first horizontal transfer electrode in the connection portion is equal to or smaller than a distance between the first horizontal transfer electrodes in the horizontal charge transfer portion.

With this solid-state imaging device, a potential barrier formed between the final vertical transfer electrode and the first horizontal transfer electrode in the connection portion can be made equal to or smaller than that formed between the first horizontal transfer electrodes in the horizontal charge transfer portion. Accordingly, even when the drive voltage of the horizontal charge transfer portion is lowered, it is possible to suppress sufficiently the transfer defect in the connection portion of the vertical charge transfer portion and the horizontal charge transfer portion, thereby suppressing the generation of display abnormalities caused by the transfer defect in the connection portion.

In the above-mentioned solid-state imaging device, it is preferable that a first potential barrier region is formed between the final vertical transfer electrode and the first horizontal transfer electrode in the connection portion, and a second potential barrier region is formed between the first horizontal transfer electrodes in the horizontal charge transfer portion. This preferable example makes it possible to suppress reliably the backward charge transfer in the horizontal charge transfer portion and the connection portion.

Also, in the above-mentioned solid-state imaging device, the first potential barrier region and the second potential barrier region can be formed by setting different impurity concentrations in a region below the first horizontal transfer electrode and a region below the second horizontal transfer electrode.

In this case, it is preferable that a vertical dimension of the first potential barrier region is smaller than the distance between the final vertical transfer electrode and the first horizontal transfer electrode. With this preferable example, even when the distance between the final vertical transfer electrode and the first horizontal transfer electrode is equal to the distance between the first horizontal transfer electrodes, the potential barrier formed between the final vertical transfer electrode and the first horizontal transfer electrode can be made smaller than that formed between the first horizontal transfer electrodes. Thus, it is possible to achieve a still lower voltage for driving the horizontal charge transfer portion and suppress further the transfer defect in the connection portion of the vertical charge transfer portion and the horizontal charge transfer portion.

Further, in the above-mentioned solid-state imaging device, the first potential barrier region and the second potential barrier region also can be formed by applying different voltages to the first horizontal transfer electrode and the second horizontal transfer electrode.

Additionally, in the above-mentioned solid-state imaging device, it is preferable that the second potential barrier region is formed so as not to overlap the vertical transfer channel region. With this preferable example, the potential barrier of the connection portion of the vertical charge transfer portion and the horizontal charge transfer portion can be made even smaller. Thus, it is possible to achieve a still lower voltage for driving the horizontal charge transfer portion and suppress further the transfer defect in the connection portion of the vertical charge transfer portion and the horizontal charge transfer portion.

Furthermore, a method of the present invention for manufacturing a solid-state imaging device including a vertical charge transfer portion and a horizontal charge transfer portion that is connected to at least one end of the vertical charge transfer portion and receives a charge transferred from the vertical charge transfer portion and then transfers the charge. The method includes forming a vertical transfer channel region and a horizontal transfer channel region in a semiconductor substrate, forming a plurality of first vertical transfer electrodes and a final vertical transfer electrode arranged at a terminating end of the vertical charge transfer portion on the vertical transfer channel region, and forming a plurality of first horizontal transfer electrodes on the horizontal transfer channel region, and forming a plurality of second vertical transfer electrodes on the vertical transfer channel region so as to be arranged between the plurality of first vertical transfer electrodes, thus forming the vertical charge transfer portion, and forming a plurality of second horizontal transfer electrodes on the horizontal transfer channel region so as to be arranged between the plurality of first horizontal transfer electrodes, thus forming the horizontal charge transfer portion. In a region to be a connection portion of the vertical charge transfer portion and the horizontal charge transfer portion, the final vertical transfer electrode and the first horizontal transfer electrode are formed so as to be spaced away from each other, and the second horizontal transfer electrode is formed so that a part of the second horizontal transfer electrode is arranged between the final vertical transfer electrode and the first horizontal transfer electrode. A distance between the final vertical transfer electrode and the first horizontal transfer electrode in the region to be the connection portion is made equal to or smaller than a distance between the first horizontal transfer electrodes in the horizontal charge transfer portion.

With this manufacturing method, it is possible to suppress variation in the distance between the final vertical transfer electrode and the first horizontal transfer electrode and the distance between the first horizontal transfer electrodes in the horizontal charge transfer portion, so that the solid-state imaging device of the present invention including the horizontal charge transfer portion that operates stably even at a low voltage can be manufactured efficiently.

In the abovementioned manufacturing method, it is preferable to further include forming a first potential barrier region between the final vertical transfer electrode and the first horizontal transfer electrode and a second potential barrier region between the first horizontal transfer electrodes, by using the final vertical transfer electrode and the first horizontal transfer electrodes as a mask for an ion-implantation of an impurity that has an electrical conductivity opposite to the vertical transfer channel region and the horizontal transfer channel region. This preferable example makes it possible to manufacture efficiently a solid-state imaging device that can suppress a backward charge transfer in the horizontal charge transfer portion and the connection portion in a reliable manner.

Moreover, in the above-mentioned manufacturing method, it is preferable that, in the forming process of the first potential barrier region and the second potential barrier region, an implantation direction of the impurity is inclined toward a transfer direction in the vertical charge transfer portion or a direction opposite to the transfer direction with respect to a surface of the semiconductor substrate. With this preferable example, a vertical dimension of the first potential barrier region is made smaller than the distance between the final vertical transfer electrode and the first horizontal transfer electrode, making it possible to manufacture a solid-state imaging device that can achieve a still lower voltage for driving the horizontal charge transfer portion and suppress further the transfer defect in the connection portion of the vertical charge transfer portion and the horizontal charge transfer portion.

The following is a detailed description of preferred embodiments of the present invention.

First Embodiment

The following is a description of an example of a solid-state imaging device according to the first embodiment of the present invention, with reference to the accompanying drawings.

Figure 2:
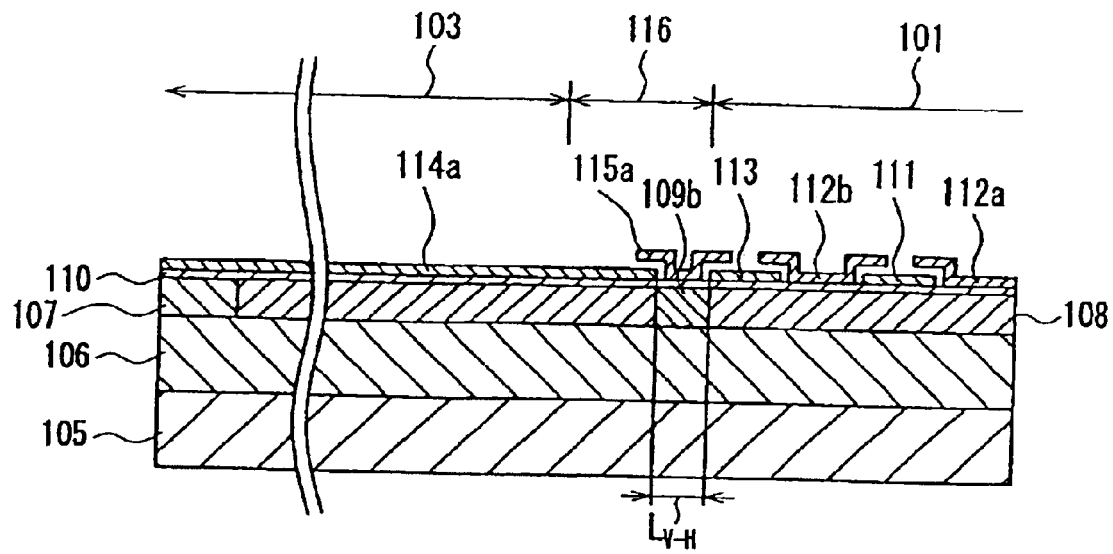
FIG. 2 is a sectional view taken along line A-A' in FIG. 1.
Figure 3:
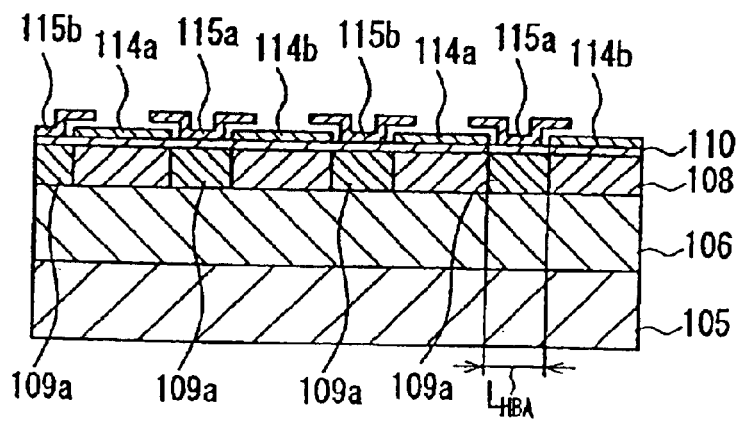
FIG. 3 is a sectional view taken along line B-B' in FIG. 1.
Figure 20:
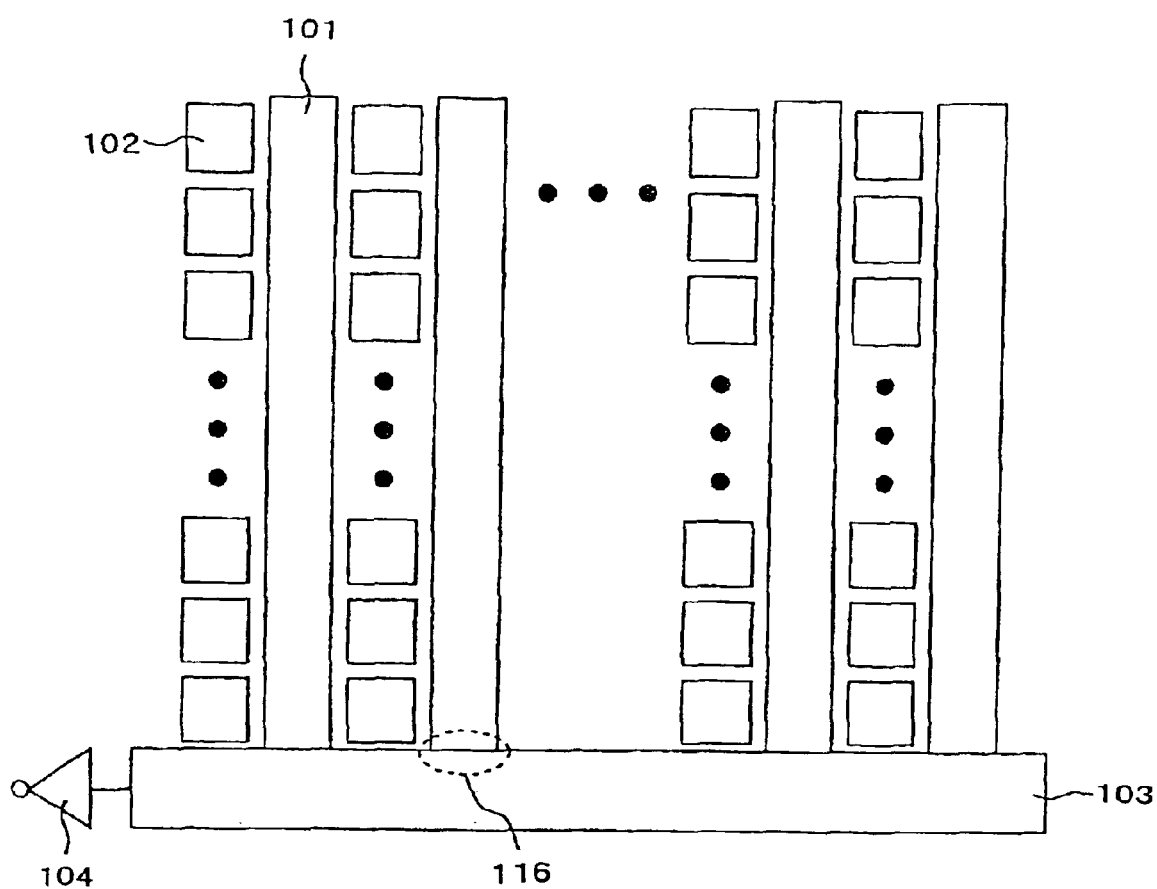
FIG. 20 is a schematic view showing an example of a configuration of the solid-state imaging device of the present invention.

FIG. 20 is a schematic view showing an example of the solid-state imaging device according to the first embodiment. FIGS. 1 to 3 are schematic views showing an example of a structure in the vicinity of a connection portion of a vertical charge transfer portion and a horizontal charge transfer portion in the above-mentioned solid-state imaging device, with FIG. 1 being a plan view, FIG. 2 being a sectional view taken along line A-A' in FIG. 1, and FIG. 3 being a sectional view taken along line B-B' in FIG. 1. In these figures, numeral 101 denotes a vertical charge transfer portion, numeral 102 denotes a photoelectric conversion portion, numeral 103 denotes a horizontal charge transfer portion, numeral 104 denotes an output circuit portion, numeral 105 denotes an N⁻-type semiconductor substrate, numeral 106 denotes a P-type well layer, numeral 107 denotes a P⁺-type element isolation region, numeral 108 denotes an N-type semiconductor region, numerals 109a, 109b and 109c denote N⁻-type semiconductor regions, numeral 110 denotes an insulating film, numerals 111, 112a, 112b and 113 denote vertical transfer electrodes, numerals 114a and 114b denote first horizontal transfer electrodes, numerals 115a and 115b denote second horizontal transfer electrodes, and numeral 116 denotes a connection portion of the vertical charge transfer portion and the horizontal charge transfer portion.

As shown in FIG. 20, this solid-state imaging device includes a plurality of the photoelectric conversion portions 102 that are arranged in a matrix, plural rows of the vertical charge transfer portions 101 that are arranged in correspondence with respective rows of the photoelectric conversion portions 102, the horizontal charge transfer portion 103 that is connected electrically to one end of each of the vertical charge transfer portions 101 and the output circuit portion 104 that is connected to one end of the horizontal charge transfer portion 103.

As shown in FIGS. 1 and 2, the vertical charge transfer portion 101 includes the N⁻⁻-type semiconductor substrate 105, the P-type well layer 106 formed on the surface of the N⁻⁻-type semiconductor substrate 105, and the N-type semiconductor region 108 serving as a vertical transfer channel region formed on the surface of the P-type well layer 106. On this N-type semiconductor region 108, a plurality of the vertical transfer electrodes 111, 112a, 112b and 113 are formed via the insulating film 110. The N-type semiconductor region 108 extends along a vertical direction, which is a transfer direction of the vertical charge transfer portion, and has an impurity concentration of, for example, $1 \times 10^{16}$ to $10 \times 10^{18}$ cm⁻³, preferably $5 \times 10^{16}$ to $5 \times 10^{17}$ cm⁻³. Each of the vertical transfer electrodes is wired so as to be supplied with a clock pulse φV1, φV2, φV3 or φV4.

As shown in FIGS. 1 and 3, the horizontal charge transfer portion 103 includes the N⁻⁻-type semiconductor substrate 105, the P-type well layer 106 formed on the surface of the N⁻⁻-type semiconductor substrate 105, and the N-type semiconductor region 108 serving as a horizontal transfer channel region formed on the surface of the P-type well layer 106. On this N-type semiconductor region 108, a plurality of the first horizontal transfer electrodes 114a and 114b are formed via the insulating film 110. Further, spaces between the first horizontal transfer electrodes in the N-type semiconductor region 108 are provided with the N-type semiconductor regions 109a serving as a potential barrier region. On these N-type semiconductor regions 109a, the second horizontal transfer electrodes 115a and 115b are formed via the insulating film 110.

In other words, one stage of the horizontal charge transfer portion includes the N-type semiconductor region 108, the N⁻-type semiconductor region 109a that is arranged in the backward stage along the transfer direction with respect to the N-type semiconductor region 108, the first horizontal transfer electrode 114a or 114b that is formed on the N-type semiconductor region 108, and the second horizontal transfer electrode 115a or 115b that is formed on the N⁻-type semiconductor region 109a. A plurality of the stages having a configuration similar to the above are aligned horizontally, thus achieving the horizontal charge transfer portion.

In the horizontal charge transfer portion 103, the N-type semiconductor region 108 functions as a region for storing charges. It is preferable that the impurity concentration thereof is equal to that of the N-type semiconductor region 108 in the vertical charge transfer portion 101. More specifically, it is, for example, $1 \times 10^{16}$ to $1 \times 10^{18}$ cm⁻³, preferably $5 \times 10^{16}$ to $5 \times 10^{17}$ cm⁻³. The N⁻-type semiconductor region 109a functions as a potential barrier region for preventing charges from being transferred backwards. The horizontal dimension ($L'_{HBA}$) of this N⁻-type semiconductor region 109a is not particularly limited and may be, for example, equal to the distance ($L'_{HBA}$) between the first horizontal transfer electrodes. The impurity concentration of the N⁻-type semiconductor region 109a is, for example, $9 \times 10^{15}$ to $9 \times 10^{17}$ cm⁻³, preferably $4 \times 10^{16}$ to $4 \times 10^{17}$ cm⁻³.

The first horizontal transfer electrodes 114a and 114b function as storage gates for storing charges, while the second horizontal transfer electrodes 115a and 115b function as barrier gates for preventing the charges from being transferred backwards. In the present embodiment, the first horizontal transfer electrode and the second horizontal transfer electrode that constitute the same stage are connected and wired so as to be supplied with the same pulse. The horizontal transfer electrode constituting each stage is wired so as to be supplied with a clock pulse φH1 or φH2.

As shown in FIGS. 1 and 2, in the connection portion 116 of the vertical charge transfer portion 101 and the horizontal charge transfer portion 103, each vertical charge transfer portion 101 is arranged so as to be connected to a different stage of the horizontal charge transfer portion 103. The vertical transfer channel region of each vertical charge transfer portion 101 extends to the connection portion and is connected to the horizontal transfer channel region of the horizontal charge transfer portion 103.

In the connection portion 116, the first horizontal transfer electrode 114a of the horizontal charge transfer portion that constitutes a stage connected to the vertical charge transfer portion is arranged so as to cover at least a part of the vertical transfer channel region that extends to the connection portion. This first horizontal transfer electrode 114a is arranged so as to be spaced away from the vertical transfer electrode 113 at the terminating end of the vertical charge transfer portion 101 (that is, the final vertical transfer electrode 113).

The space between the first horizontal transfer electrode 114a and the final vertical transfer electrode 113 is provided with the N⁻-type; semiconductor region 109b. This N⁻-type semiconductor region 109b functions as a potential barrier region for preventing charges from being transferred backwards in the connection portion 116 of the vertical charge transfer portion and the horizontal charge transfer portion. The vertical dimension ($L'_{V-H}$) of the N⁻-type semiconductor region 109b is not particularly limited and may be, for example, equal to the distance ($L_{V-H}$) between the final vertical transfer electrode 113 and the first horizontal transfer electrode 114a. The impurity concentration of the N⁻-type semiconductor region 109b is equal to that of the N⁻-type semiconductor region 109a and is, for example, $9 \times 10^{15}$ to $9 \times 10^{17}$ cm⁻³, preferably $4 \times 10^{16}$ to $4 \times 10^{17}$ cm⁻³.

Further, in the connection portion 116, the second horizontal transfer electrode 115a of the horizontal charge transfer portion that constitutes a stage connected to the vertical charge transfer portion is arranged so as to cover the space between the final vertical transfer electrode 113 and the first horizontal transfer electrode 114a. In other words, in the connection portion 116, the second horizontal transfer electrode 115a covers the N⁻-type semiconductor region 109b.

In the above-described solid-state imaging device, in the connection portion 116, the distance ($L_{V-H}$) between the final vertical transfer electrode 113 of the vertical charge transfer portion and the first horizontal transfer electrode 114a constituting the stage connected to this vertical charge transfer portion is equal to or smaller than the distance ($L_{HBA}$) between the first horizontal transfer electrode 114a and the first horizontal transfer electrode 114b constituting a stage adjacent thereto.

In other words, in the second horizontal transfer electrode 118a constituting the stage connected to the vertical charge transfer portion, the vertical length of a portion located between the final vertical transfer electrode 113 and the first horizontal transfer electrode 114a is equal to or smaller than the horizontal length of a portion located between the first horizontal transfer electrodes of the horizontal charge transfer portion. Here, "the length of electrode" refers to the length of a portion formed on the semiconductor region via the insulating film. For example, in the case where a part of the second horizontal transfer electrode 115a is formed on the other electrodes (the second horizontal transfer electrode 114a, the vertical transfer electrode 113) as shown in FIGS. 1 to 3, it is the length of a portion except the portion formed on the above-noted other electrodes.

A smaller distance ($L_{V-H}$) between the final vertical transfer electrode 113 and the first horizontal transfer electrode 114a achieves a greater short channel effect in the N⁻-type semiconductor region 109b, and thus can improve the charge transfer efficiency from the vertical charge transfer portion 101 to the horizontal charge transfer portion 103. In order to achieve a sufficient short channel effect, the distance $L_{V-H}$ preferably is 3 μm or smaller, and more preferably is 1.5 μm or smaller.

Furthermore, the distance ($L_{HBA}$) between the first horizontal transfer electrode 114a and the first horizontal transfer electrode 114b is not particularly limited as long as it is equal to or larger than the distance $L_{V-H}$, but can be, for example, 3 μm or smaller, and preferably 1.5 μm or smaller for achieving an excellent transfer efficiency in the horizontal charge transfer portion.

There is no particular lower limit set on the distance LV-H and the distance $L_{HBA}$. However, it is preferable that these distances are equal to or larger than a workable minimum dimension in the process for forming the electrodes (or example, lithography and etching) and more specifically, at least 0.2 μm.

Moreover, it is preferable that the distance ($L_{V-H}$) between the final vertical transfer electrode 113 and the first horizontal transfer electrode 114a is 50% to 100% of the distance ($L_{HBA}$) between the first horizontal transfer electrode 114a and the first horizontal transfer electrode 114b.

Next, the operation of the above-described solid-state imaging device will be described.

Figure 4:
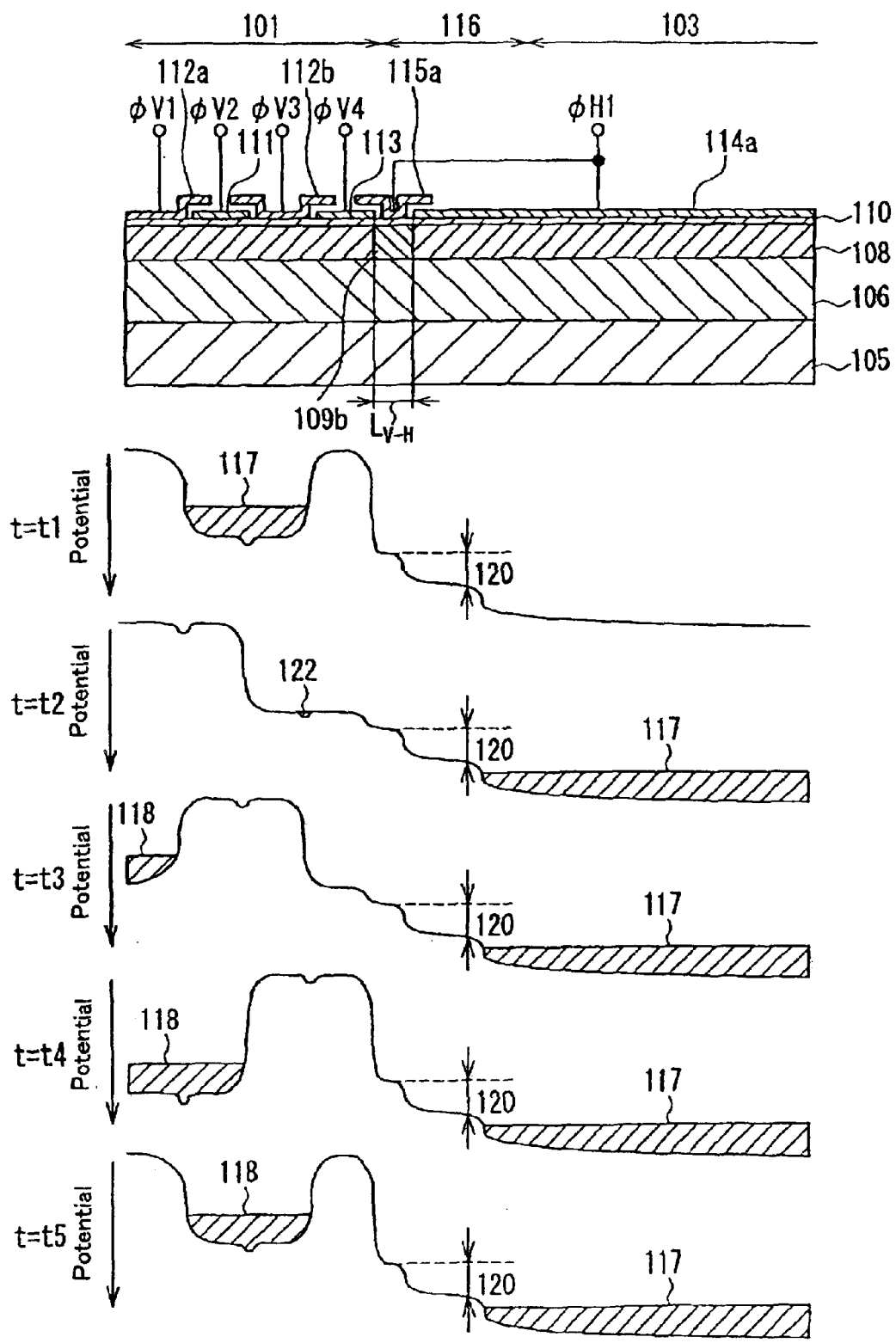
FIG. 4 shows a potential distribution in a connection portion of a vertical charge transfer portion and a horizontal charge transfer portion when the solid-state imaging device is driven.
Figure 5:
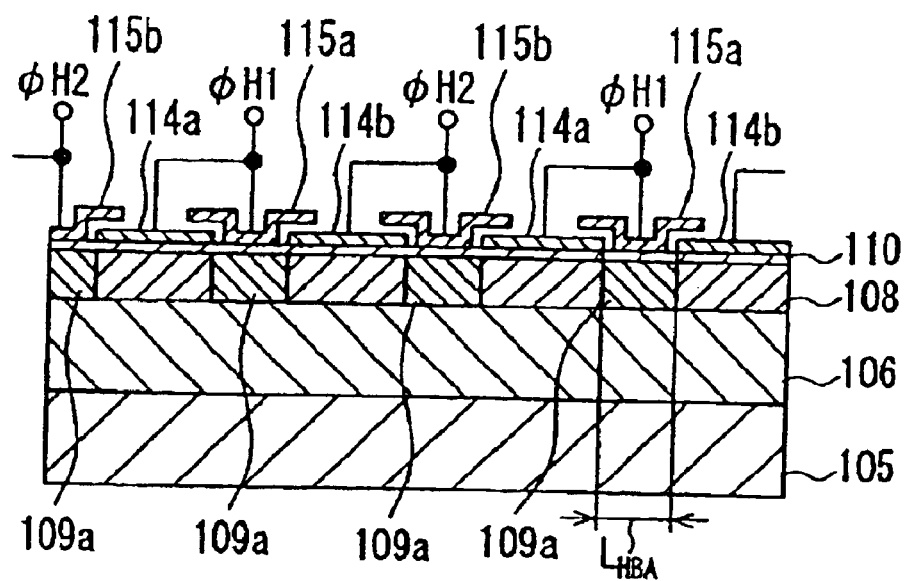
FIG. 5 shows a potential distribution in the horizontal charge transfer portion when the solid-state imaging device is driven.
Figure 5:
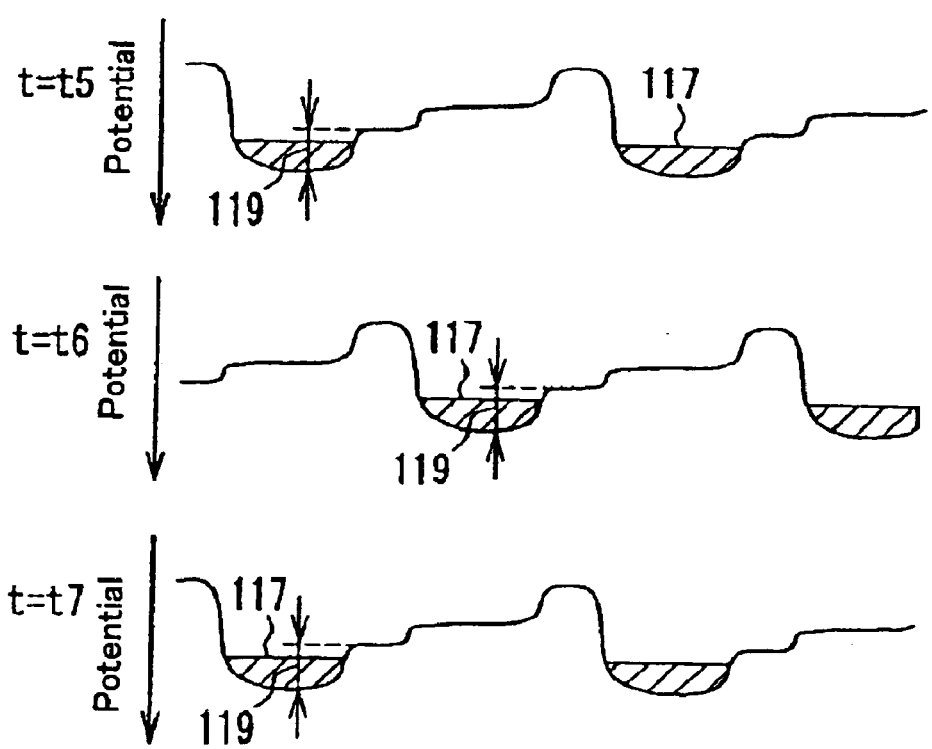
Figure 26:
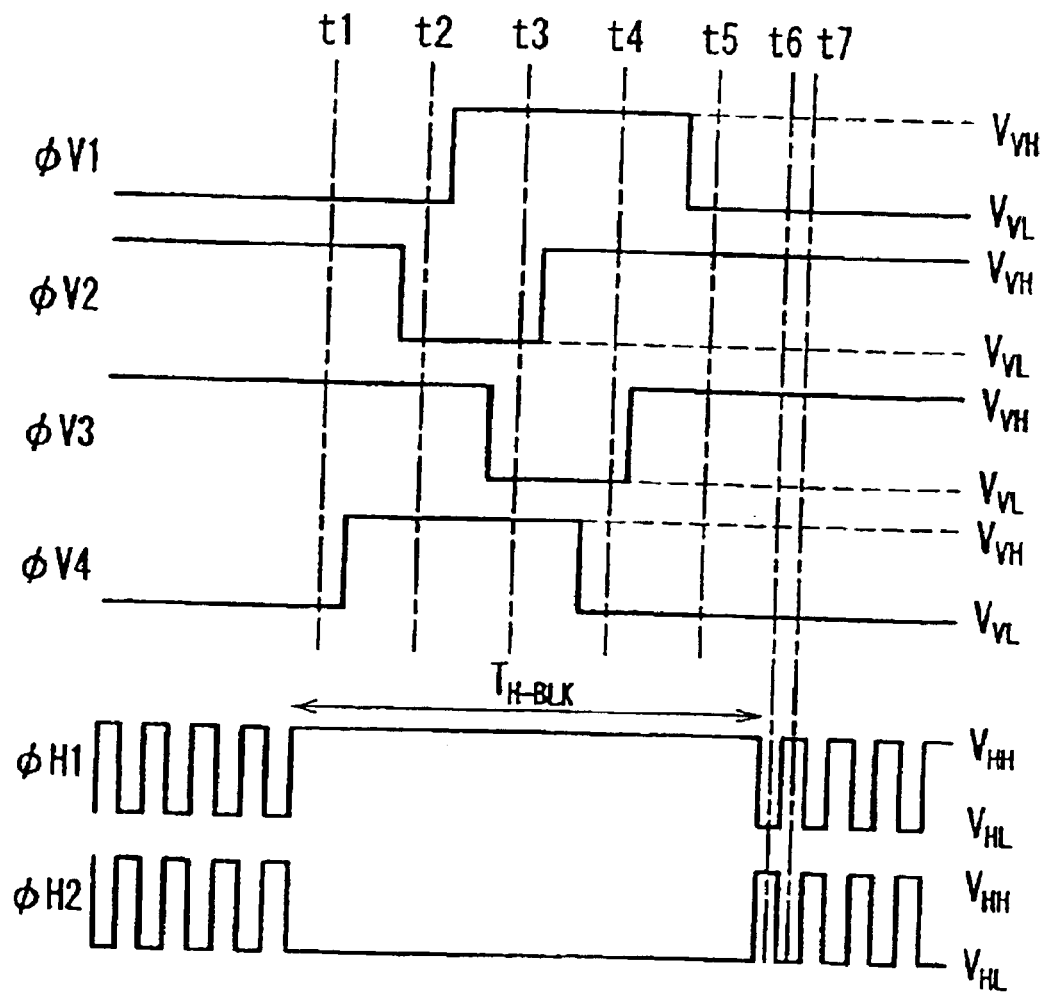
FIG. 26 illustrates an example of clock pulses for driving the solid-state imaging device of the present invention.

FIG. 26 illustrates an example of a clock pulse to be applied to each transfer electrode in the vertical charge transfer portion and the horizontal charge transfer portion. In this figure, φV1 to φV4 indicate pulses to be applied to the vertical transfer electrodes, while φH1 and φH2 indicate pulses to be applied to the horizontal transfer electrodes. In each pulse, $V_{VH}$ and $V_{HH}$ indicate a high voltage, while $V_{VL}$ and $V_{HL}$ indicate a low voltage. FIGS. 4 and 5 show a potential distribution at the time of driving with the pulses shown in FIG. 26, with FIG. 4 showing a potential distribution of the connection portion of the vertical charge transfer portion and the horizontal charge transfer portion and FIG. 5 showing a potential distribution of the horizontal charge transfer portion.

In the above-described solid-state imaging device, first, a signal charge generated in the photoelectric conversion portion is read out to the vertical charge transfer portion. This signal charge is transferred vertically in the vertical charge transfer portion, and then transferred from the vertical charge transfer portion to the horizontal charge transfer portion. Subsequently, it is transferred horizontally in the horizontal charge transfer portion and reaches the output circuit portion.

The following is a description of the charge transfer operation from the vertical charge transfer portion to the horizontal charge transfer portion, with reference to FIGS. 26 and 4.

The charge is transferred from the vertical charge transfer portion to the horizontal charge transfer portion during a period in which the charge transfer in the horizontal charge transfer portion is stopped, namely, a horizontal: blanking period. In this period, φH1 is $V_{HH}$ and φH2 is $V_{HL}$. Accordingly, the potentials below the horizontal transfer electrodes 114a and 115a that constitute the stage connected to the vertical charge transfer portion is higher than those below the horizontal transfer electrodes 114b and 115b that constitute the other stage. Also, since the N⁻-type semiconductor region 109a is formed below the second horizontal transfer electrode 115a, the potential below the second horizontal transfer electrode 115a is lower than that below the first horizontal transfer electrode 114a, and a potential barrier 119 is formed in this portion. Consequently, the potential below the first horizontal transfer electrode 114a constituting the stage connected to the vertical charge transfer portion becomes higher than the other portion, and a potential well is formed in this portion (see FIG. 5).

At time t1, $V_{VH}$ is applied to φV2 and φV3, and $V_{VL}$ is applied to φV1 and φV4, whereby a signal charge 117 is stored below the vertical transfer electrodes 111 and 112b that are supplied with the high voltage $V_{VH}$.

At time t2, φV4 changes from $V_{VL}$ to $V_{VH}$ and φV2 changes from $V_{VH}$ to $V_{VL}$, whereby the signal charge 117 except for a slight transfer residue 122 of the signal charge is transferred from the vertical charge transfer portion 101 to the horizontal charge transfer portion 103. Further, at time t3, φV1 changes from $V_{VL}$ to $V_{VH}$ and φV3 changes from $V_{VH}$ to $V_{VL}$, whereby the transfer residue 122 of the signal charge is transferred from the vertical charge transfer portion 101 to the horizontal charge transfer portion 103, and the transfer operation of the signal charge 117 from the vertical charge transfer portion 101 to the horizontal charge transfer portion 103 ends.

In the charge transfer from the vertical charge transfer portion 101 to the horizontal charge transfer portion 103, the signal charge 117 is transferred via the portion below the final vertical transfer electrode 113 and the portion below the second horizontal transfer electrode 115a arranged between the final vertical transfer electrode 113 and the first horizontal transfer electrode 114a to the potential well formed below the first horizontal transfer electrode 114a. At this time, since the N⁻-type semiconductor region 109b is formed below the second horizontal transfer electrode 115a arranged between the final vertical transfer electrode 113 and the first horizontal transfer electrode 114a as shown in FIG. 4, the potential below the second horizontal transfer electrode 115a is lower than that below the first horizontal transfer electrode 114a, and a potential barrier 120 is formed in this portion. This potential barrier 120 prevents the signal charge from being transferred backwards in the connection portion.

Subsequently, at time t4, φV2 changes from $V_{VL}$ to $V_{VH}$ and φV4 changes from $V_{VH}$ to $V_{VL}$, whereby the next signal charge 118 is transferred to the portions below the first charge vertical transfer electrode 111 and the vertical transfer electrode 112a that are supplied with the high voltage $V_{VH}$. Finally, at time t5, φV3 changes from $V_{VL}$ to $V_{VH}$ and φV1 changes from $V_{VH}$ to $V_{VL}$, whereby the next signal charge 118 is transferred to the portions below the vertical transfer electrodes 111 and 112a that are supplied with $V_{VH}$, thus returning to an initial state equivalent to that at time t1.

The following is a description of the charge transfer operation in the horizontal charge transfer portion, with reference to FIGS. 26 and 5.

When the charge transfer from the vertical charge transfer portion to the horizontal charge transfer portion ends (at time t5), φH1 is $V_{HH}$ and φH2 is $V_{HL}$ as described above. At this time, a potential well is formed below the first horizontal transfer electrode 114a, and the signal charge 117 that has been transferred from the vertical charge transfer portion is stored in this portion.

Subsequently, at time t6, φH1 changes from $V_{HH}$ to $V_{HL}$ and φH2 changes from $V_{HL}$ to $V_{HH}$, whereby the potentials below the horizontal transfer electrodes 114a and 115a become lower than those below the horizontal transfer electrodes 114b and 115b. Also, since the N⁻-type semiconductor region 109a is formed below the second horizontal transfer electrode 115b, the potential below the second horizontal transfer electrode 115b is lower than that below the first horizontal transfer electrode 114b, and the potential barrier 119 is formed in this portion. Consequently, the potential below the first horizontal transfer electrode 114b becomes higher than that of the other portion, and the signal charge is stored in this portion. Further, this potential barrier 119 prevents the signal charge from being transferred backwards.

Then, at time t7, φH1 changes from $V_{HL}$ to $V_{HH}$ and φH2 changes from $V_{HH}$ to $V_{HL}$, whereby the potential below the first horizontal transfer electrode 114a becomes higher than that of the other portion, and the signal charge is stored in this portion. By repeating this operation, the signal charge 117 is transferred through the horizontal charge transfer portion.

Next, the effect to be achieved by the above-described solid-state imaging device will be discussed.

As described above, in the above-described solid-state imaging device, the distance ($L_{V-H}$) between the final vertical transfer electrode 113 of the vertical charge transfer portion 101 and the first horizontal transfer electrode 114a of the horizontal charge transfer portion 103 is equal to or smaller than the distance ($L_{HBA}$) between the first horizontal transfer electrode 114a and the first horizontal transfer electrode 114b adjacent thereto.

Therefore, the short channel effect in the N⁻-type semiconductor region 109b in the connection portion of the vertical charge transfer portion and the horizontal charge transfer portion is equivalent to or larger than that in the N⁻-type semiconductor region 109a in the horizontal charge transfer portion. Accordingly, the potential of the N⁻-type semiconductor region 109b in the connection portion can be made equal to or higher than that of the N-type semiconductor region 109a in the horizontal charge transfer portion. Consequently, even when a lower voltage is applied to the horizontal transfer electrode, as long as it is within the range capable of suppressing the transfer defect sufficiently in the horizontal charge transfer portion, the transfer defect can be suppressed sufficiently in the connection portion of the vertical charge transfer portion and the horizontal charge transfer portion. As a result, display abnormalities caused by the transfer defect (for example, a vertical line display abnormality on a screen, so-called black line defect) can be suppressed while achieving a lower drive voltage.

Second Embodiment

Next, an example of a method for manufacturing the solid-state imaging device according to the first embodiment will be described. FIGS. 6 and 7 are drawings for describing an example of the method for manufacturing the above-mentioned solid-state imaging device, with FIG. 6 corresponding to an A-A' cross-section of FIG. 1 and FIG. 7 corresponding to a B-B' cross-section of FIG. 1.

First, the P-type well layer 106 is formed on the surface of the N⁻⁻-type semiconductor substrate 105, and the N-type semiconductor region 108 to be a transfer channel of the vertical charge transfer portion and the horizontal charge transfer portion is formed on the surface of the P-type well layer 106. Then, on the surface of the N-type semiconductor region 108, the insulating film 110 such as a silicon oxide film or a silicon nitride film is formed.

On the insulating film 110, at least the final vertical transfer electrode 113, a plurality of the first horizontal transfer electrodes 114a and 114b are formed. At this time, it is preferable that other vertical transfer electrodes 111 in the vertical charge transfer portion also are formed simultaneously (in the following, the vertical transfer electrodes to be formed simultaneously with the final vertical transfer electrode will be referred to as "the first vertical transfer electrodes.").

A plurality of the first horizontal transfer electrodes 114a and 114b are aligned horizontally so as to be spaced away from each other. Also, the final vertical transfer electrode 113 and the first horizontal transfer electrode 114a are formed so as to be spaced away from each other. At this time, the distance between the final vertical transfer electrode 113 and the first horizontal transfer electrode 114a is adjusted to be equal to or smaller than the distance between the first horizontal transfer electrodes 114a and 114b that are adjacent to each other in the horizontal direction. Incidentally, specific values of these distances are described above.

Figure 6A:
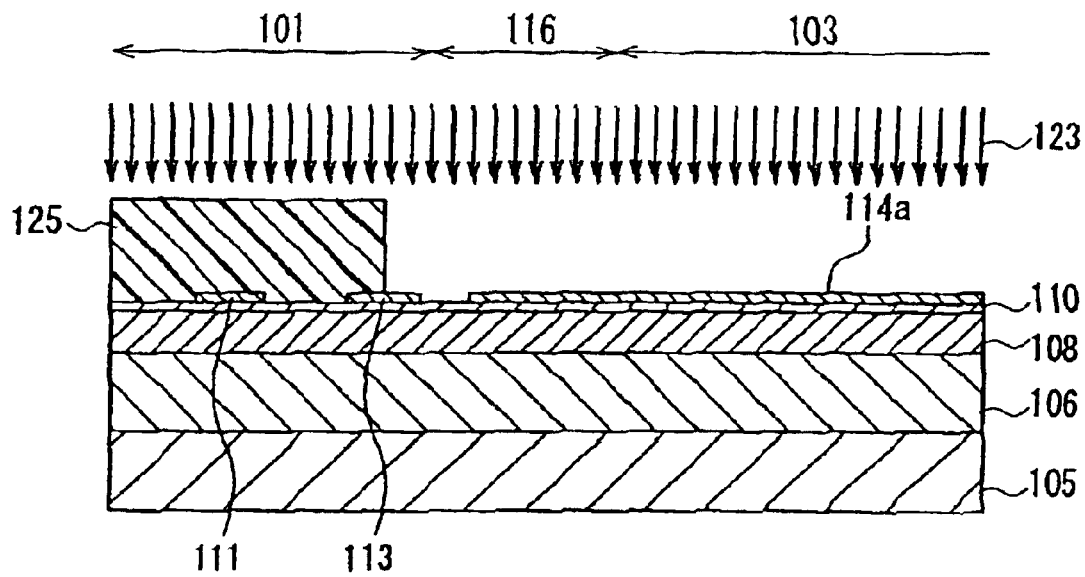
FIG. 6 is a sectional view showing an exemplary process of a method for manufacturing the solid-state imaging device and corresponds to the A-A' cross-section of FIG. 1.
Figure 6B:
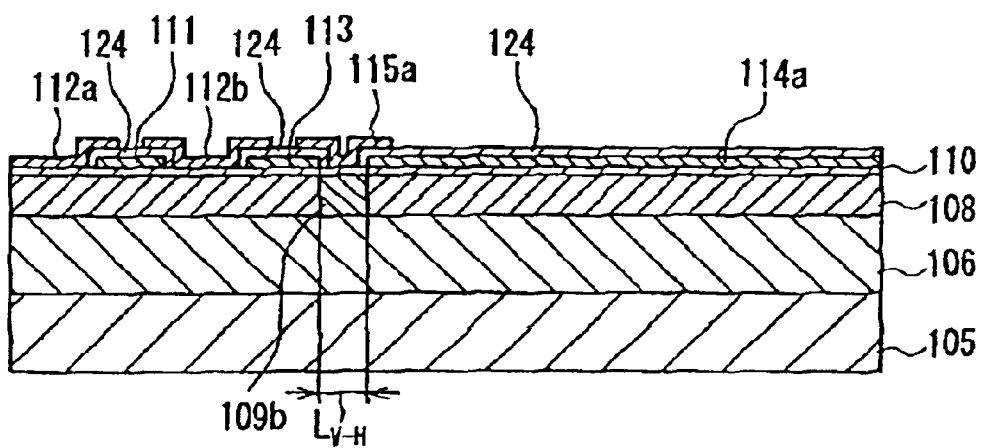

Subsequently, a photoresist 125 is formed so as to cover entirely a region in which the vertical charge transfer portion is to be formed. As shown in FIGS. 6A and 7B, this photoresist 125 is formed so as not to cover a region to be the connection portion 116 of the vertical charge transfer portion and the horizontal charge transfer portion and a region in which the horizontal charge transfer portion 103 is to be formed. In other words, the space between the final vertical transfer electrode 113 and the first horizontal transfer electrode 114a and the space between the first horizontal transfer electrodes 114a and 114b are not covered with the photoresist 125.

Figure 7A:
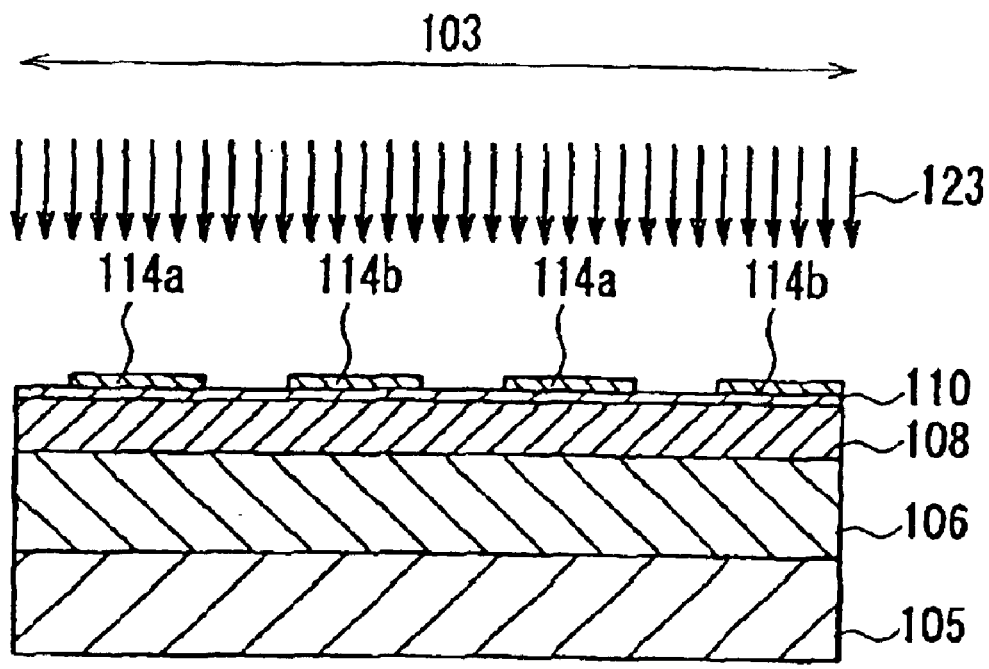
FIG. 7 is a sectional view showing an exemplary process of the method for manufacturing the solid-state imaging device and corresponds to the B-B' cross-section of FIG. 1.
Figure 7B:
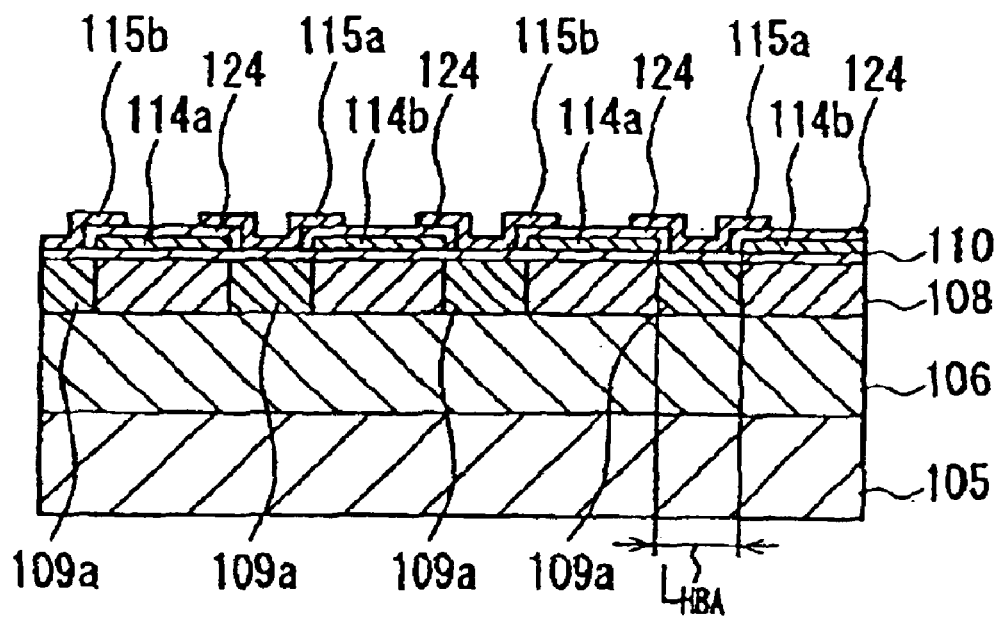

Using the photoresist 12S, the final vertical transfer electrode 113, the first horizontal transfer electrodes 114a and 114b as a mask, P-type impurities, for example, boron (B) or boron fluoride ($BF_2$) are ion-implanted in the substrate (see FIGS. 6A and 7A). Although an implantation direction 123 of the impurities is not particularly limited, it is substantially perpendicular to the substrate surface in the present embodiment.

By this ion implantation, the P-type impurities are embedded into the N-type semiconductor region 108 in the space between the final vertical transfer electrode 113 and the first horizontal transfer electrode 114a and the space between the first horizontal transfer electrodes 114a and 114b that are adjacent to each other in the horizontal direction. As a result, in the space between the final vertical transfer electrode 113 and the first horizontal transfer electrode 114a and the space between the first horizontal transfer electrodes 114a and 114b, the N⁻-type semiconductor regions 109b and 109a respectively are formed in a self-aligned manner.

Thereafter, an interlayer insulating film 124 is formed so as to cover the final vertical transfer electrode 113, the first horizontal transfer electrodes 114a and 114b. Furthermore, the second horizontal transfer electrodes 115a and 115b are formed in the space between the first horizontal transfer electrodes (see FIG. 7B). At this time, in the connection portion 116, the second horizontal transfer electrode 115a is formed so as to cover the space between the final vertical transfer electrode 113 and the first horizontal transfer electrode 114a. Simultaneously, the vertical transfer electrodes 112a and 112b are formed respectively in the space between the final vertical transfer electrode 113 and the first vertical transfer electrode 111 and the space between the first vertical transfer electrodes 111 (see FIG. 6B) (In the following, the vertical transfer electrodes formed in this process will be referred to as "the second vertical transfer electrodes."). Thereafter, a wiring and a shielding film, for example, are provided as necessary, thereby obtaining a solid-state imaging device.

According to the above-described manufacturing method, the final vertical transfer electrode 113 and the first horizontal transfer electrode 114a are formed in a single process, and further, the N⁻-type semiconductor regions 109a and 109b are formed in a self-aligned manner by a single ion-implantation process using these electrodes as a mask. Thus, by setting the space between the final vertical transfer electrode 113 and the first horizontal transfer electrode 114a to be equal to or smaller than the space between the first horizontal transfer electrodes 114a and 114b, it is possible to manufacture the above-described solid-state imaging device efficiently.

Third Embodiment

Figure 8:
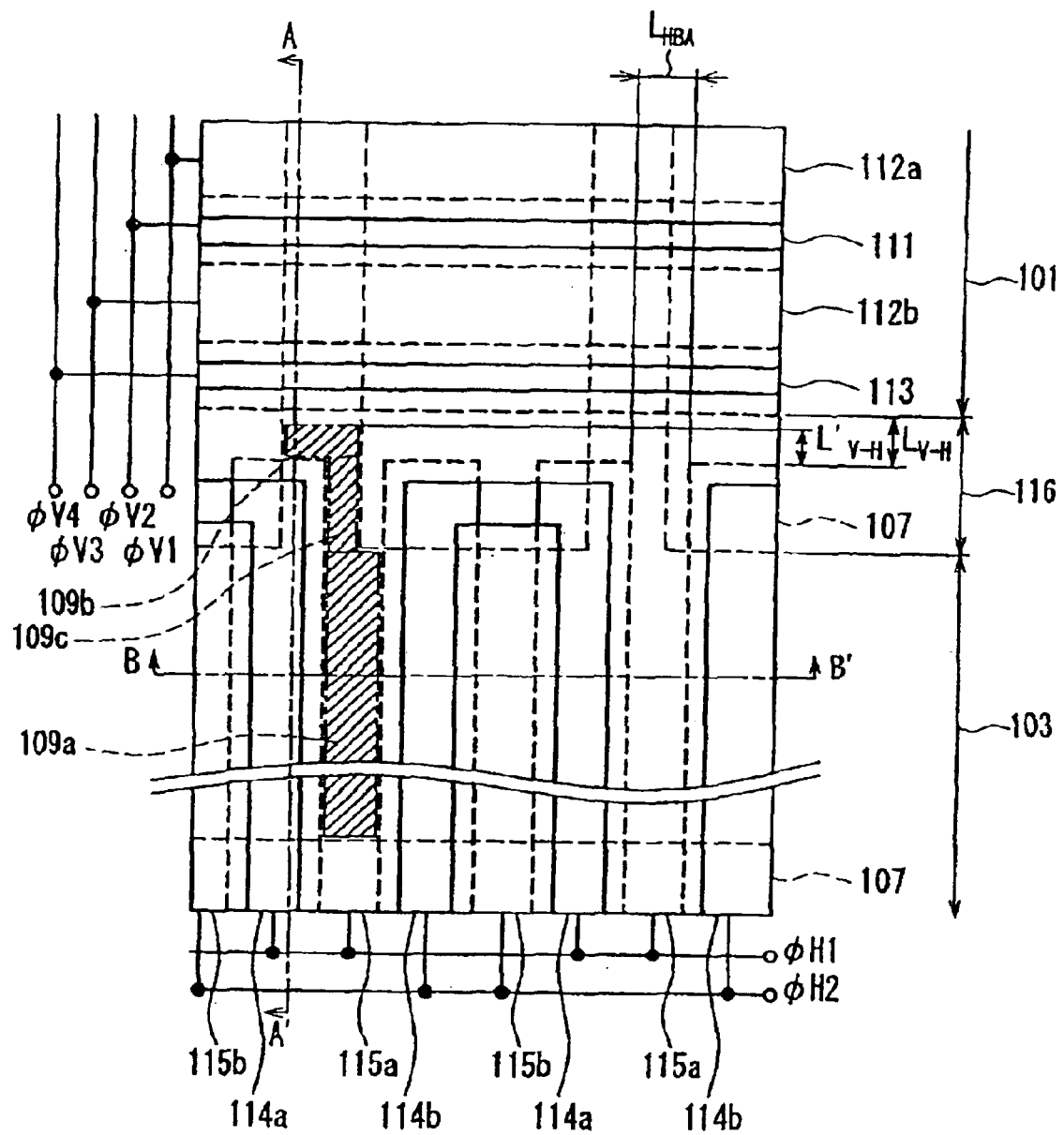
FIG. 8 is a plan view showing an example of a structure of a solid-state imaging device according to a third embodiment of the present invention.
Figure 9:
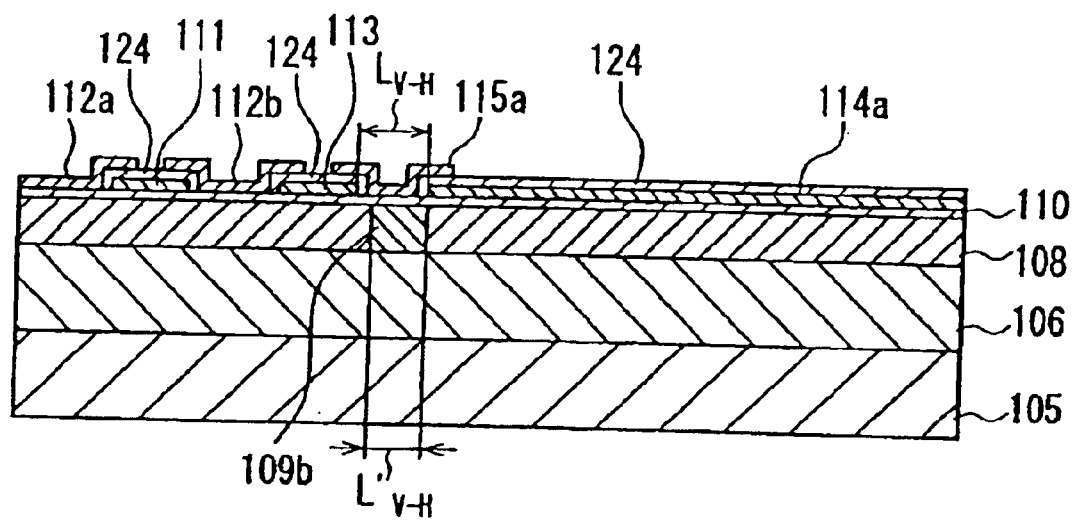
FIG. 9 is a sectional view taken along line A-A' in FIG. 8.
Figure 10:
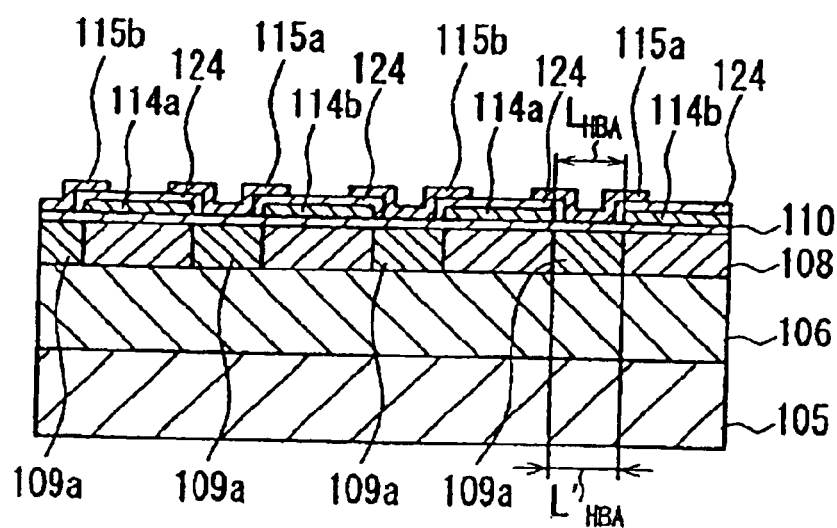
FIG. 10 is a sectional view taken along line B-B' in FIG. 8.

FIGS. 8 to 10 show an example of a structure of a solid-state imaging device according to the third embodiment of the present invention. These figures are schematic views showing an example of a structure in the vicinity of a connection portion of a vertical charge transfer portion and a horizontal charge transfer portion, with FIG. 8 being a plan view, FIG. 9 being a sectional view taken along line A-A' in FIG. 8, and FIG. 10 being a sectional view taken along line B-B' in FIG. 8. In these figures, members equivalent to those in FIG. 1 are given the same numerals.

As shown in FIGS. 8 and 9, in the connection portion 116 of the vertical charge transfer portion 101 and the horizontal charge transfer portion 103 of this solid-state imaging device, the N⁻-type semiconductor region 109b is formed in the space between the final vertical transfer electrode 113 and the first horizontal transfer electrode 114a. The vertical dimension ($L'_{V-H}$) of this N⁻-type semiconductor region 109b is adjusted to be smaller than the distance ($L_{V-H}$) between the final vertical transfer electrode 113 and the first horizontal transfer electrode 114a.

It is preferable that the vertical dimension ($L'_{V-H}$) of the N⁻-type semiconductor region 109b is 50% to 100% of the distance ($L_{V-H}$) between the final vertical transfer electrode 113 and the first horizontal transfer electrode 114a.

A specific value of the vertical dimension ($L'_{V-H}$) of the N⁻-type semiconductor region 109b is not particularly limited but can be set suitably according to the impurity concentration of the N⁻-type semiconductor region 109b, the thickness of the insulating film 110 and a drive voltage. The above-mentioned dimension ($L'_{V-H}$) may be, for example, 3 $\mu$m or smaller, preferably 1.5 $\mu$m or smaller.

On the other hand, in the horizontal charge transfer portion 103, the N⁻-type semiconductor region 109a is formed in the space between the first horizontal transfer electrodes 114a and 114b. The horizontal dimension ($L'_{HBA}$) of this N⁻-type semiconductor region 109a is equal to the distance ($L_{HBA}$) between the first horizontal transfer electrodes 114a and 114b.

Thus, in not only the case where the distance ($L_{V-H}$) between the final vertical transfer electrode 113 and the first horizontal transfer electrode 114a is smaller than the distance ($L_{HBA}$) between the first horizontal transfer electrodes 114a and 114b but also the case where the former is equal to the latter, the vertical length ($L'_{V-H}$) of the N⁻-type semiconductor region 109b formed in the connection portion 116 is smaller than the horizontal length ($L'_{HBA}$) of the N⁻-type semiconductor region 109a formed in the horizontal charge transfer portion 103.

As described above, in this solid-state imaging device, the vertical length ($L'_{V-H}$) of the N⁻-type semiconductor region 109b is smaller than the horizontal length ($L'_{HBA}$) of the N⁻-type semiconductor region 109a. Thus, in not only the case where the distance ($L_{V-H}$) between the final vertical transfer electrode 113 and the first horizontal transfer electrode 114a in the connection portion 116 is smaller than the distance ($L_{HBA}$) between the first horizontal transfer electrodes 114a and 114b in the horizontal charge transfer portion 103 but also the case where the former is equal to the latter ($L_{V-H}=L_{HBA}$), the potential of the N⁻-type semiconductor region 109b in the connection portion 116 can be made higher than that of the N⁻-type semiconductor region 109a in the horizontal charge transfer portion 103. Consequently, the effect described in the first embodiment becomes greater, so that a still lower drive voltage can be achieved and display abnormalities caused by the transfer defect (or example, a vertical line display abnormality on a screen, so-called black line defect) can be suppressed further.

As described above, the present embodiment is effective in the case where the distance ($L_{V-H}$) between the final vertical transfer electrode and the first horizontal transfer electrode is equal to the distance ($L_{HBA}$) between the first horizontal transfer electrodes, and particularly effective in the case where, for example, ever finer pixels bring about the need for forming both of the distances ($L_{V-H}$) and ($L_{HBA}$) in a minimum workable dimension for lithography and etching.

It should be noted that the above-described solid-state imaging device has a structure similar to that of the solid-state imaging device according to the first embodiment except that the vertical dimension ($L'_{V-H}$) of the N⁻-type semiconductor region 109b is smaller than the distance ($L_{V-H}$) between the final vertical transfer electrode 113 and the first horizontal transfer electrode 114a. Also, the operation of the above-described solid-state imaging device is substantially the same as that in the first embodiment, and therefore, the detailed description thereof is omitted.

Next, an example of a method for manufacturing the above-described solid-state imaging device will be described. FIGS. 11 and 12 are drawings for describing an example of the method for manufacturing the above-described solid-state imaging device, with FIG. 11 corresponding to an A-A' cross-section of FIG. 8 and FIG. 12 corresponding to a B-B' cross-section of FIG. 8.

First, the P-type well layer 106 is formed on the surface of the N⁻⁻-type semiconductor substrate 105, and the N-type semiconductor region 108 is formed on the surface of the P-type well layer 106. Further, on the N-type semiconductor region, the final vertical transfer electrode 113, the first vertical transfer electrode 111, the first horizontal transfer electrodes 114a and 114b are formed via the insulating film 110. Subsequently, the photoresist 125 is formed so as to cover entirely a region in which the vertical charge transfer portion is to be formed. These processes are carried out by a method similar to the manufacturing method described in the second embodiment.

Figure 11A:
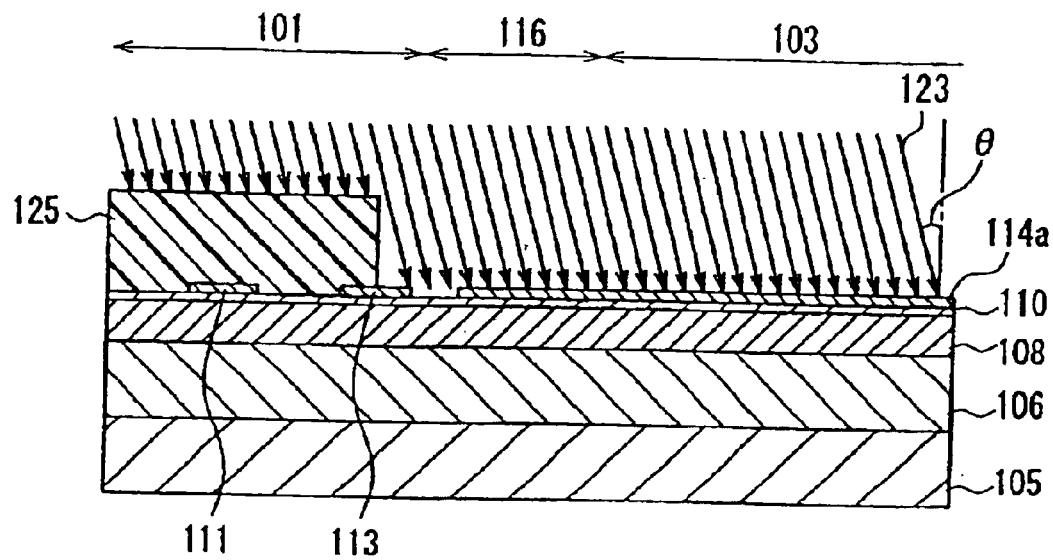
FIG. 11 is a sectional view showing an exemplary process of a method for manufacturing the solid-state imaging device and corresponds to the A-A' cross-section of FIG. 8.
Figure 12A:
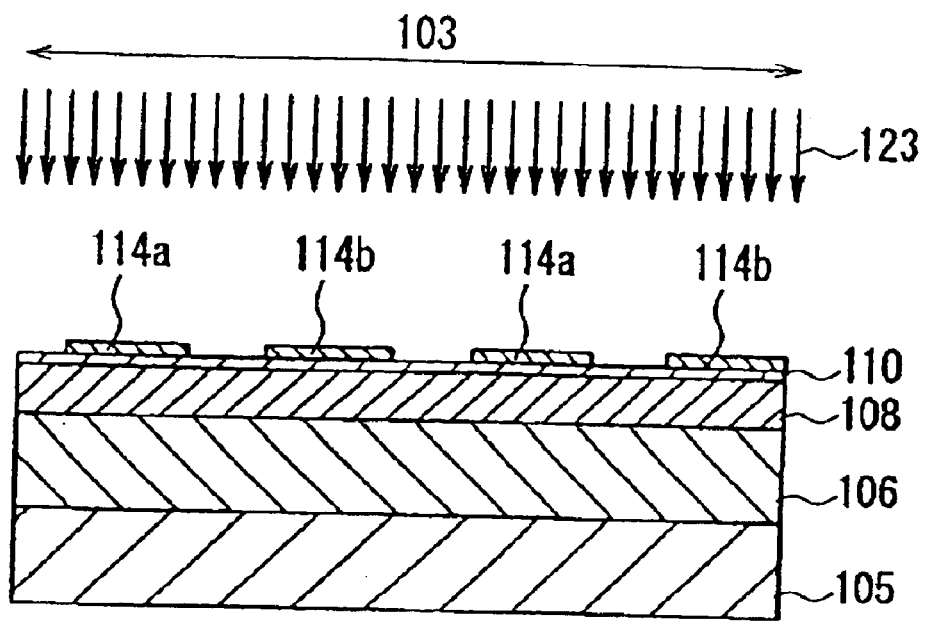
FIG. 12 is a sectional view showing an exemplary process of the method for manufacturing the solid-state imaging device and corresponds to the B-B' cross-section of FIG. 8.

Then, using the photoresist 125, the final vertical transfer electrode 113, the first horizontal transfer electrodes 114a and 114b as a mask, P-type impurities, for example, boron (B) or boron fluoride ($BF_2$) are ion-implanted in the substrate (see FIGS. 11A and 12A). By this ion implantation, in the space between the final vertical transfer electrode 113 and the first horizontal transfer electrode 114a and the space between the first horizontal transfer electrodes 114a and 114b, the N⁻-type semiconductor regions 109b and 109a respectively are formed in a self-aligned manner.

As shown in FIG. 11A, in the present embodiment, this ion implantation is carried out while the implantation direction 123 of the P-type impurities is inclined from the direction perpendicular to the substrate surface toward the transfer direction of the vertical charge transfer portion. This makes it possible to form the N⁻-type semiconductor region 109b so as to be spaced away from the final vertical transfer electrode 113. As a result, the vertical length ($L'_{V-H}$) of the N-type semiconductor region 109b can be made smaller than the distance ($L_{V-H}$) between the final vertical transfer electrode 113 and the first horizontal transfer electrode 114a without being subjected to mask displacement or the like.

Figure 12B:
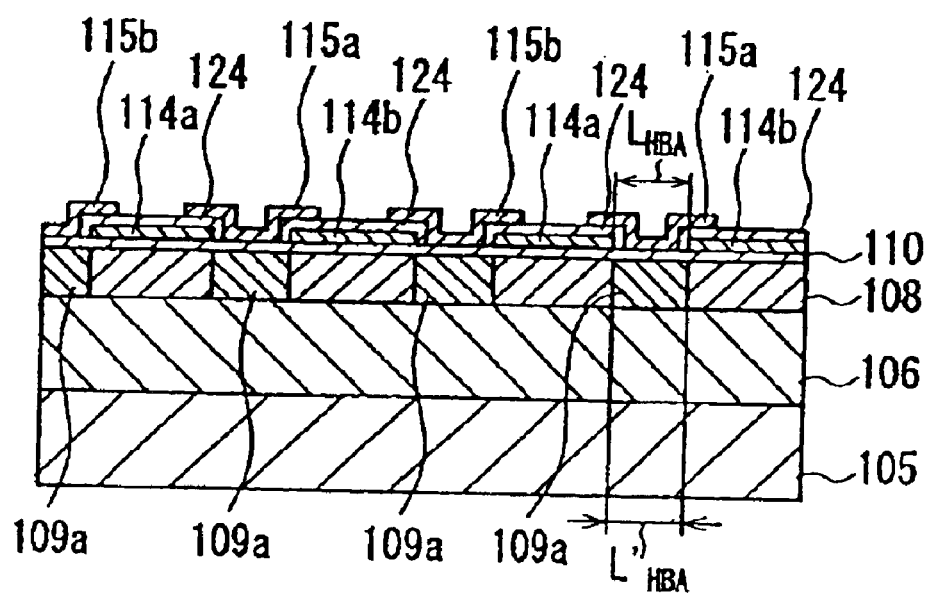

Further, since the ion-implantation direction is inclined toward the transfer direction of the vertical charge transfer portion, the horizontal length ($L'_{HBA}$) of the N⁻-type semiconductor region 109a formed in the horizontal charge transfer portion is equal to the distance ($L_{HBA}$) between the first horizontal transfer electrodes as shown in FIG. 12B.

Thus, even in the case where the distance ($L_{V-H}$) between the final vertical transfer electrode and the first horizontal transfer electrode is equal to the distance ($L_{HBA}$) between the first horizontal transfer electrodes, the vertical length ($L'_{V-H}$) of the N-type semiconductor region 109b formed in the connection portion is smaller than the horizontal length ($L'_{HBA}$) of the N⁻-type semiconductor region 109a formed in the horizontal charge transfer portion.

There is no particular limitation on an angle (θ) at which the implantation direction is inclined. However, when the inclination angle (θ) is too large, the N⁻-type semiconductor region 109b may reach excessively deep below the final vertical transfer electrode 113 or below the first horizontal transfer electrode 114a. Thus, the inclination angle (θ) preferably is not greater than 45°. Further preferably, it is 5° to 30°.

Figure 11B:
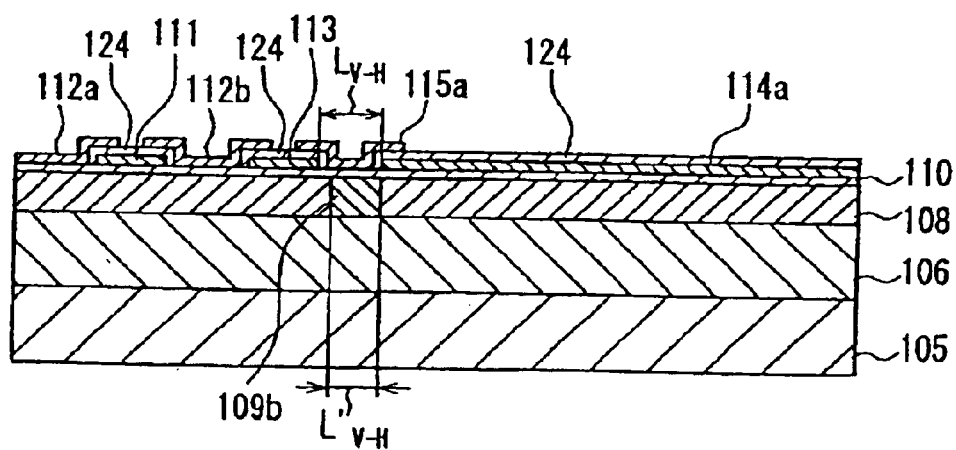

Thereafter, the interlayer insulating film 124, the second horizontal transfer electrodes 115a and 115b and the second vertical transfer electrode are formed (see FIGS. 11B and 12B). This process can be conducted in a method similar to the manufacturing method described in the second embodiment. Then, a wiring and a shielding film, for example, are provided as necessary, thereby obtaining a solid-state imaging device.

According to the above-described manufacturing method, the final vertical transfer electrode 113 and the first horizontal transfer electrode 114a are formed in a single process, and the N⁻-type semiconductor regions 109a and 109b are formed in a self-aligned manner by a single ion-implantation process using these electrodes as a mask, as in the manufacturing method described in the second embodiment. Thus, it is possible to manufacture the above-described solid-state imaging device efficiently.

Figure 13A:
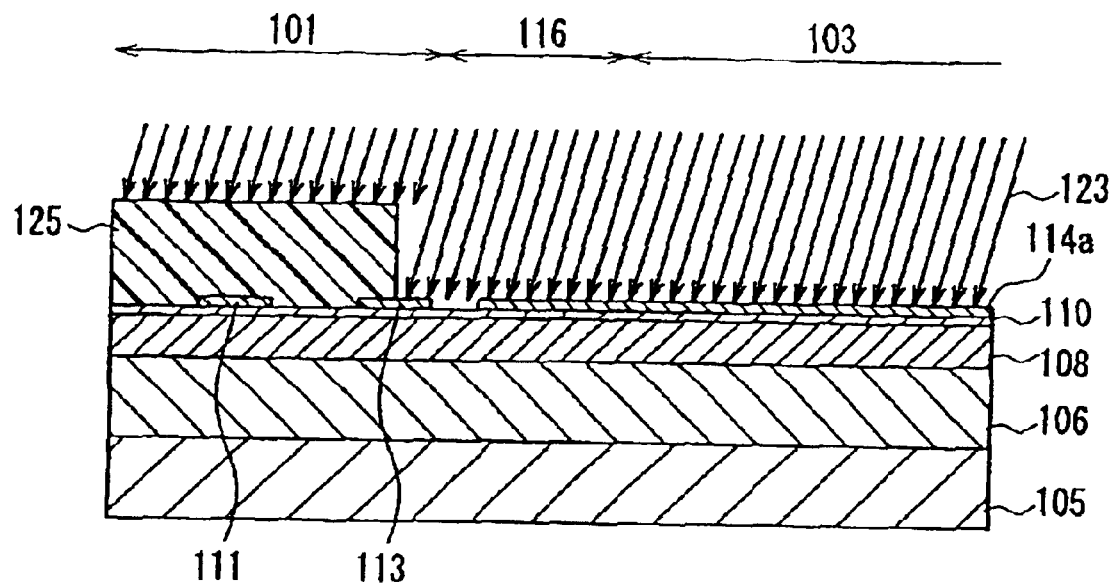
FIG. 13 is a sectional view showing another exemplary process of the method for manufacturing the solid-state imaging device and corresponds to the A-A' cross-section of FIG. 8.
Figure 13B:
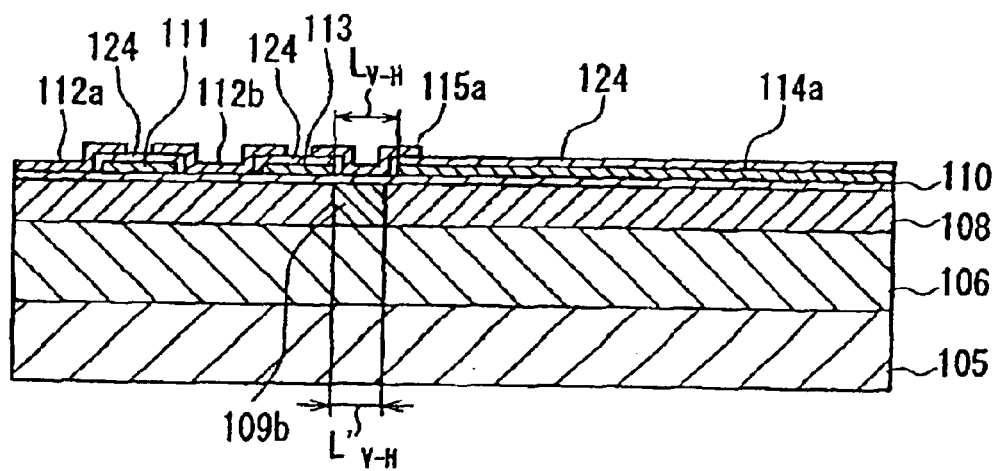

In the above-described manufacturing method, the ion-implantation direction 123 may be inclined toward a direction opposite to the transfer direction of the vertical charge transfer portion as shown in FIG. 13A. In this case, the N⁻-type semiconductor region 109b can be formed so as to be spaced away from the first horizontal transfer electrode 114a as shown in FIG. 13B. As a result, the vertical length ($L'_{V-H}$) of the N⁻-type semiconductor region 109b can be made smaller than the distance ($L_{V-H}$) between the final vertical transfer electrode 113 and the first horizontal transfer electrode 114a, thus obtaining the effect similar to the above.

Fourth Embodiment

In the solid-state imaging device of the first embodiment, the N⁻-type semiconductor regions 109a and 109b are provided, thereby forming the potential barriers 119 and 120 for preventing the backward charge transfer in the connection portion of the vertical charge transfer portion and the horizontal charge transfer portion and the portion between the first horizontal transfer electrodes in the horizontal charge transfer portion. However, the present invention is not limited to the above. For example, these potential barriers also can be formed by applying different voltages to the first horizontal transfer electrode and the second horizontal transfer electrode. The following is a description of such an embodiment.

Figure 14:
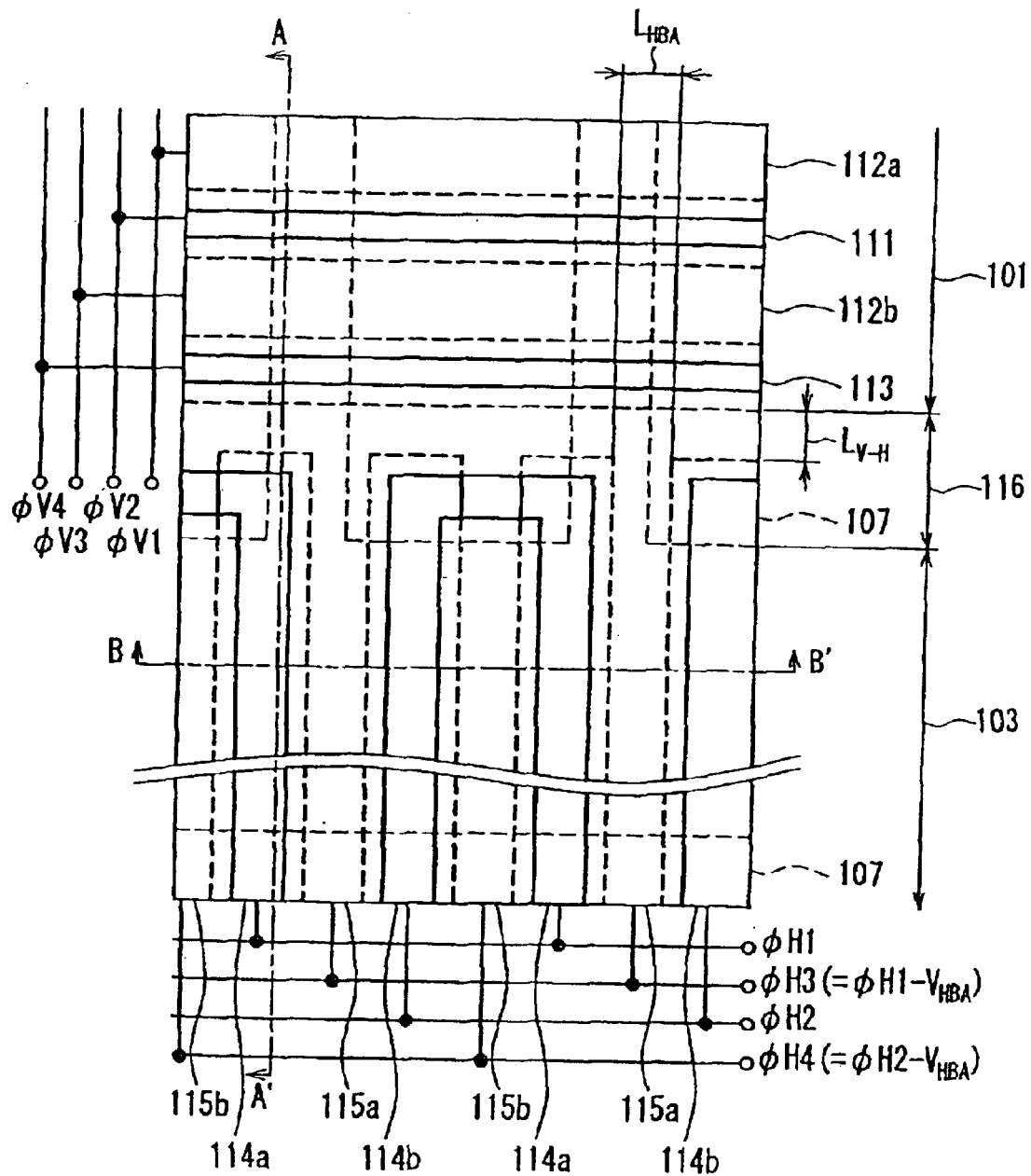
FIG. 14 is a plan view showing an example of a structure of a solid-state imaging device according to a fourth embodiment of the present invention.
Figure 15A:
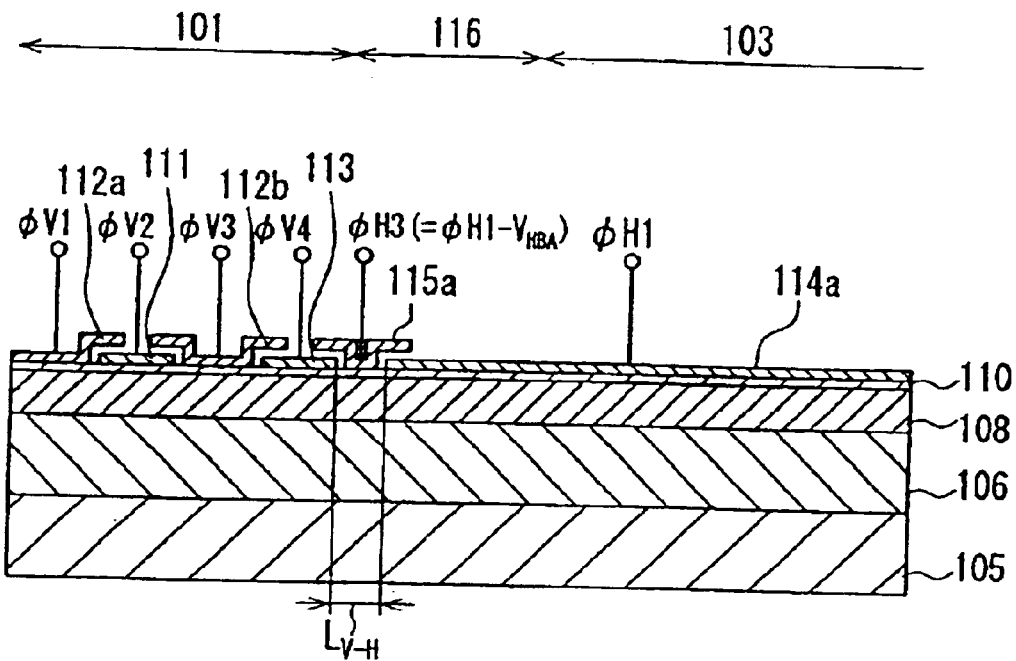
FIG. 15A is a sectional view taken along line A-A' in FIG. 14.
Figure 15B:
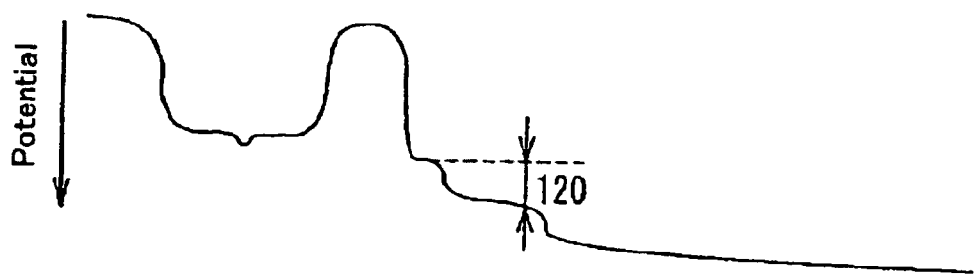
FIG. 15B shows a potential distribution in a portion shown in FIG. 15A.
Figure 16A:
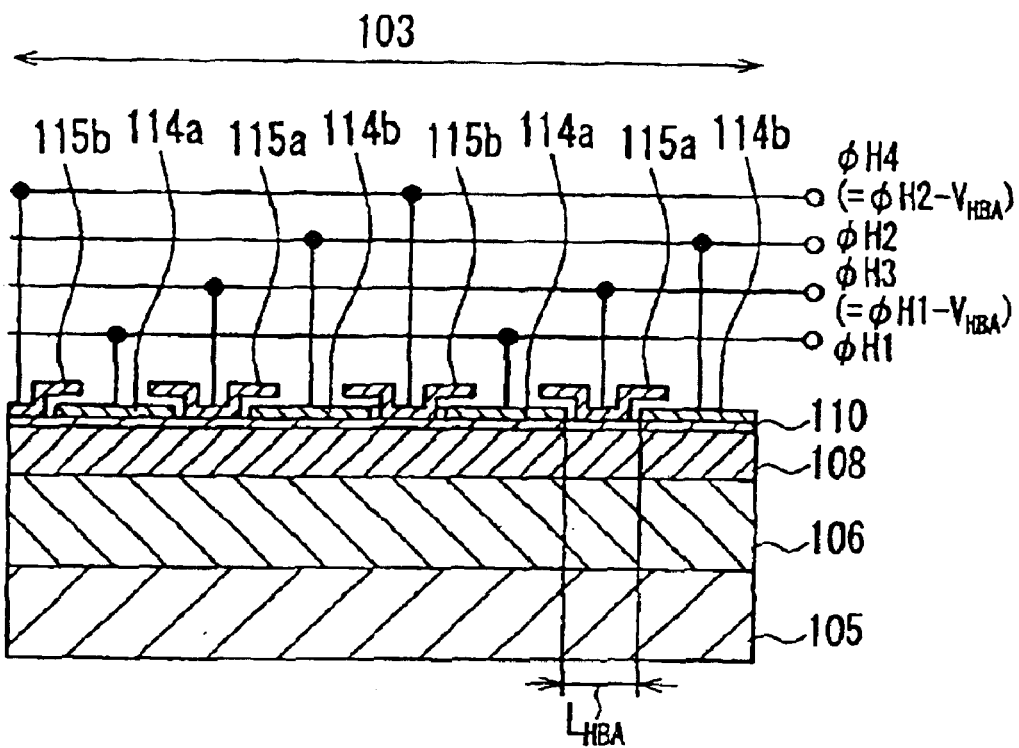
FIG. 16A is a sectional view taken along line A-A' in FIG. 14.
Figure 16B:
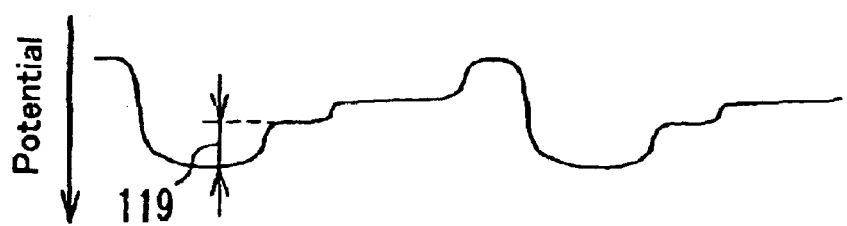
FIG. 16B shows a potential distribution in a portion shown in FIG. 16A.

FIGS. 14 to 16 show an example of a structure of a solid-state imaging device according to the fourth embodiment of the present invention. These figures are schematic views showing an example of a structure in the vicinity of a connection portion of a vertical charge transfer portion and a horizontal charge transfer portion, with FIG. 14 being a plan view, FIG. 15 being a sectional view taken along line A-A' in FIG. 14, and FIG. 16 being a sectional view taken along line B-B' in FIG. 14. In these figures, members equivalent to those in FIG. 1 are given the same numerals.

As shown in FIGS. 14 and 16, in the horizontal charge transfer portion of this solid-state imaging device, the space between the first horizontal transfer electrodes 114a and 114b (the portions below the second horizontal transfer electrodes 115a and 115b) is provided with the N-type semiconductor region 108 as in the portions below the first horizontal transfer electrodes 114a and 114b. In other words, in the solid-state imaging device in the present embodiment, the N⁻-type semiconductor regions 109a as described in the first embodiment is not provided. In the present embodiment, the first horizontal transfer electrode and the second horizontal transfer electrode that constitute the same stage are wired so as to be supplied with different clock pulses.

Furthermore, as shown in FIGS. 14 and 15, in the connection portion 116 of the vertical charge transfer portion and the horizontal charge transfer portion, the first horizontal transfer electrode 114a is arranged so as to be spaced away from the final vertical transfer electrode 113, and this space between the first horizontal transfer electrode 114a and the final vertical transfer electrode 113 is covered with the second horizontal transfer electrode 115a, as in the first embodiment. However, in the present embodiment, the space between the first horizontal transfer electrode 114a and the final vertical transfer electrode 113 is provided with the N-type semiconductor region 108 that extends from the vertical charge transfer portion. In other words, the space between the first horizontal transfer electrode 114a and the final vertical transfer electrode 113 is not provided with the N-type semiconductor region 109b unlike the first embodiment.

Incidentally, the above-mentioned solid-state imaging device has a structure similar to that of the solid-state imaging device according to the first embodiment except that the N⁻-type semiconductor regions 109a and 109b are not provided and the first horizontal transfer electrode and the second horizontal transfer electrode that constitute the same stage are wired so as to be supplied with different pulses.

When driving the solid-state imaging device of the present embodiment, different clock pulses are applied to the first horizontal transfer electrode and the second horizontal transfer electrode that constitute the same stage in the horizontal charge transfer portion. For example, as shown in FIGS. 14 to 16, a clock pulse φH1 is applied to the first horizontal transfer electrode 14a, and a clock pulse φH3 is applied to the second horizontal transfer electrode 115b that constitutes the same stage as the first horizontal transfer electrode 114a. Further, in the other stage adjacent to the above-noted stage, a clock pulse φH2 is applied to the first horizontal transfer electrode 114b, and a clock pulse φH4 is applied to the second horizontal transfer electrode 115b.

The pulse φH3 is obtained by offsetting the pulse φH1 in a negative direction. In other words, φH3 has a waveform equivalent to φH1 except that its voltage value is shifted toward a negative side. The pulse φH4 is obtained by offsetting the pulse φH2 in the negative direction. In other words, φH4 has a waveform equivalent to φH2 except that its voltage value is shifted toward the negative side. It should be noted that φH1 and φH2 respectively have waveforms equivalent to φH1 and φH2 in the first embodiment, for example.

Instead of shifting φH3 and φH4 on the negative side with respect to φH1 and φH2, it may be possible to shift φH1 and φH2 on the positive side with respect to φH1 and φH2.

There is no particular limitation on how much the pulses (φH3 and φH4) to be applied to the second horizontal transfer electrodes are offset from the pulses (φH1 and φH2) to be applied to the first horizontal transfer electrodes (namely, a potential difference $V_{HBA}$). In general, as the potential difference $V_{HBA}$ increases, a maximum transfer capacity in the horizontal charge transfer portion can be increased but a minimum drive voltage of the horizontal charge transfer portion tends to rise. Therefore, it is preferable that the potential difference $V_{HBA}$ is set suitably according to a desired transfer capacity and a desired drive voltage and set to, for example, 0.5 to 2.5 V The potential difference $V_{HBA}$ is a difference between a reference voltage of the pulse to be applied to the first horizontal transfer electrode and that of the pulse to be applied to the second horizontal transfer electrode and can be expressed by, for example, a difference between high voltages of these pulses or a difference between low voltages thereof.

FIGS. 15 and 16 show a potential distribution when φH1 and φH3 are the high voltages and φH2 and φH4 are the low voltages, with FIG. 15 showing a potential distribution of the connection portion of the vertical charge transfer portion and the horizontal charge transfer portion and FIG. 16 showing a potential distribution of the horizontal charge transfer portion.

As shown in these figures, in the present embodiment, the voltages applied to the second horizontal transfer electrodes 115a and 115b are set on the negative side with respect to those applied to the first horizontal transfer electrodes 114a and 114b, thereby forming the potential barriers 119 and 120 for preventing the backward transfer respectively in the connection portion of the vertical charge transfer portion and the horizontal charge transfer portion and the portion between the first horizontal transfer electrodes in the horizontal charge transfer portion. In addition, since φH3 and φH4 respectively are obtained by offsetting φH1 and φH2 on the negative side, these potential barriers 119 and 120 always are formed.

Also in the present embodiment, it should be noted that the drive pulses applied to the vertical transfer electrodes can be pulses φV1 to φV4 similar to those in the first embodiment. Further, the charge transfer operation in the present embodiment is substantially the same as that in the first embodiment except that the potential barriers 119 and 120 are formed by the potential difference between the first and second horizontal transfer electrodes as described above, and therefore, the detailed description thereof is omitted.

As described above, according to the present embodiment, the potential barriers for preventing the backward charge transfer are formed by applying the different voltages to the first horizontal transfer electrode and the second horizontal transfer electrode. Accordingly, the N⁻-type semiconductor regions 109a and 109b as in the first embodiment do not have to be formed, and thus, the ion-implantation process for forming these N⁻-type semiconductor regions are unnecessary. Thus, there is an advantage that the manufacturing process can be shortened.

Furthermore, by changing the difference ($V_{HBA}$) between the voltages applied to the first horizontal transfer electrodes 114a and 114b and those applied to the second horizontal transfer electrodes 115a and 115b, how high the potential barriers 119 and 120 would be can be changed freely. As a result, there also is an advantage that the minimum drive voltage and the maximum transfer charge amount of the horizontal charge transfer portion can be adjusted freely. Incidentally, this voltage difference ($V_{HBA}$) can be changed easily by a system using the solid state imaging device.

Fifth Embodiment

Figure 17:
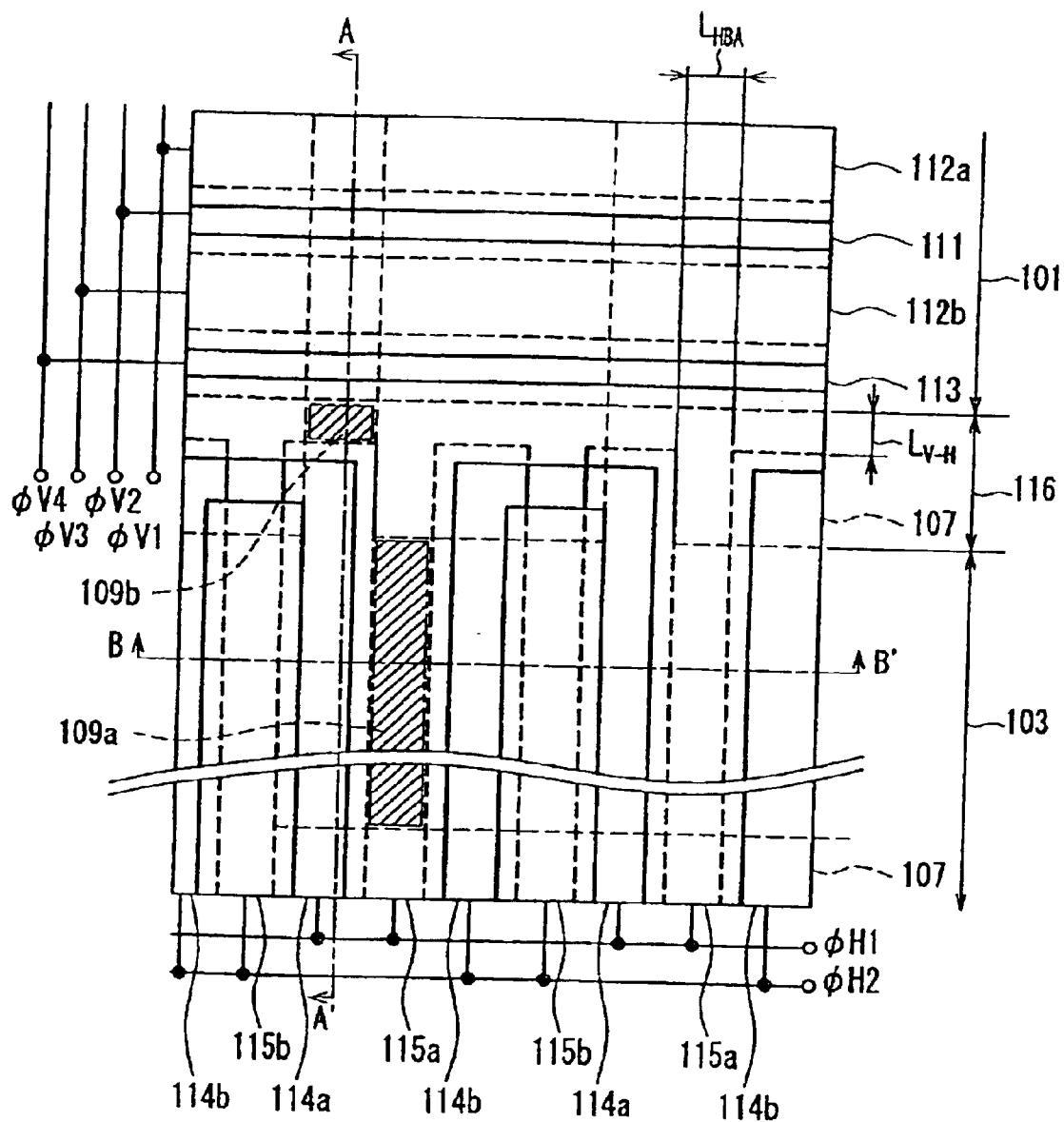
FIG. 17 is a plan view showing an example of a structure of a solid-state imaging device according to a fifth embodiment of the present invention.
Figure 18:
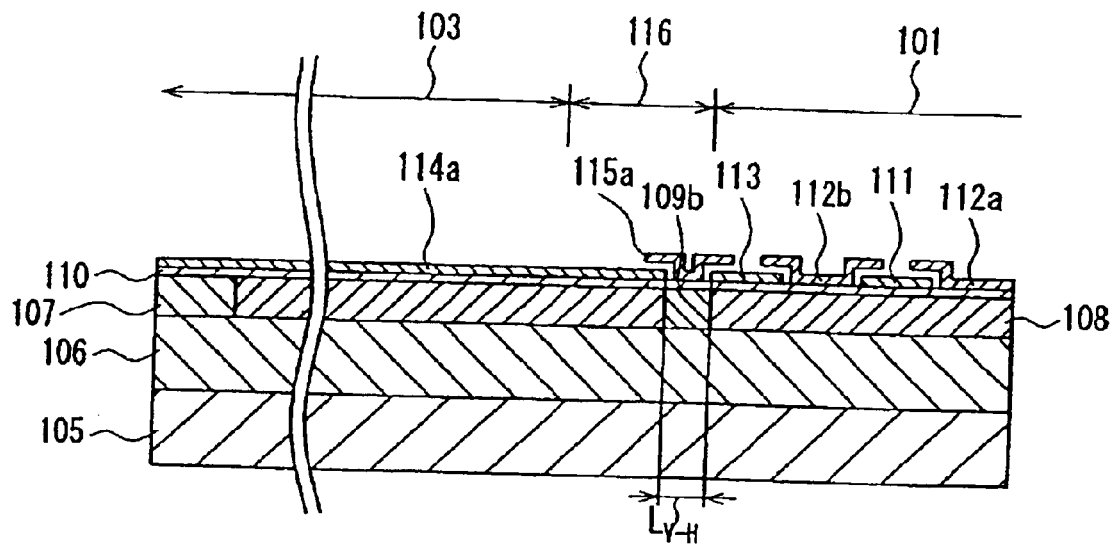
FIG. 18 is a sectional view taken along line A-A' in FIG. 17.
Figure 19:
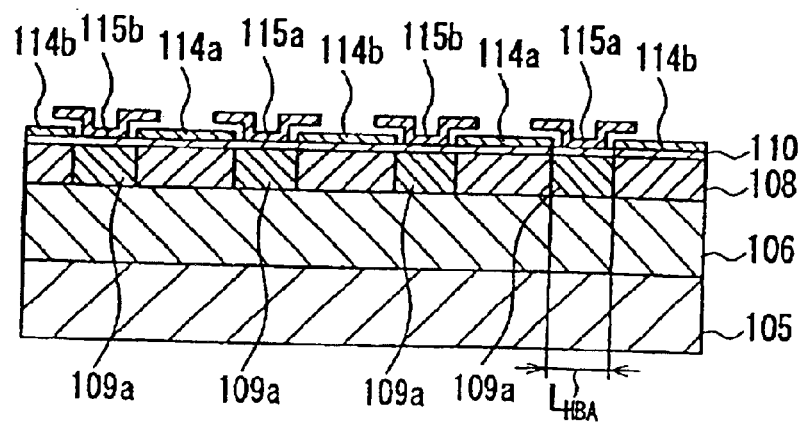
FIG. 19 is a sectional view taken along line B-B' in FIG. 17.

FIGS. 17 to 19 show an example of a structure of a solid-state imaging device according to the fifth embodiment of the present invention. These figures are schematic views showing an example of a structure in the vicinity of a connection portion of a vertical charge transfer portion and a horizontal charge transfer portion, with FIG. 17 being a plan view, FIG. 18 being a sectional view taken along line A-A' in FIG. 17, and FIG. 19 being a sectional view taken along line B-B' in FIG. 17. In these figures, members equivalent to those in FIG. 1 are given the same numerals.

As shown in FIG. 17, in the connection portion 116 of the vertical charge transfer portion and the horizontal charge transfer portion of this solid-state imaging device, the N⁻-type semiconductor region 109b is formed in the space between the final vertical transfer electrode 113 and the first horizontal transfer electrode 114a, while in the horizontal charge transfer portion 103, the N⁻-type semiconductor region 109a is formed in the space between the first horizontal transfer electrodes 114a and 114b, as in the first embodiment. However, in the present embodiment, the N⁻-type semiconductor region formed in the space between the first horizontal transfer electrodes is formed so as not to overlap the vertical transfer channel region that extends from the vertical charge transfer portion, in the connection portion. In other words, in the connection portion 116, a region corresponding to the N⁻-type semiconductor region 109c in the first embodiment is not provided.

According to such a solid-state imaging device, since the N⁻-type semiconductor region 109c as in the first embodiment is not provided in the connection portion 116, it is possible to reduce further the potential barrier in the connection portion of the vertical charge transfer portion and the horizontal charge transfer portion. Thus, there is an advantage that the transfer defect can be suppressed further in the connection portion of the vertical charge transfer portion and the horizontal charge transfer portion.

The above-described solid-state imaging device may have a structure similar to that of the solid-state imaging device according to the first embodiment except that the N⁻-type semiconductor region 109c is not provided. However, it is preferable that the first horizontal transfer electrode 114a covers the entire vertical transfer channel region that extends to the connection portion 116 except the region in which the N⁻-type semiconductor region 109b is formed as shown in FIG. 17.

For example, in the electrode arrangement as shown in FIG. 1, the charge transferred from the vertical charge transfer portion to the horizontal charge transfer portion is received by both of the first horizontal transfer electrode 114a and the second horizontal transfer electrode 115a (the discussion here is directed to the portion located between the first horizontal transfer electrodes 114a and 114b). Accordingly, a part of the charge is transferred via the portion below the second horizontal transfer electrode 116a to the portion below the first horizontal transfer electrode 114a. On the other hand, in the electrode arrangement as shown in FIG. 17, the charge transferred from the vertical charge transfer portion to the horizontal charge transfer portion is received only by the first horizontal transfer electrode 114a. Therefore, the charge can be transferred to the portion below the first horizontal transfer electrode 114a smoothly without being transferred via the portion below the second horizontal transfer electrode 115a.

The above-described solid-state imaging device can be manufactured by covering with the first horizontal transfer electrode 114a the entire vertical transfer channel region that extends to the region to be the connection portion 116 except the region in which the N⁻-type semiconductor region 109b is formed, at the time of forming the first horizontal transfer electrode in the manufacturing method described in the second embodiment.

In addition, the charge transfer operation in the present embodiment is substantially the same as that in the first embodiment, and therefore, the detailed description thereof is omitted.

Although the first to fifth embodiments described above have illustrated the case where the vertical charge transfer portion and the horizontal charge transfer portion have transfer electrodes with a two-layer structure, the present invention is not limited to this. For example, they may have a layered structure with three or more layers of the transfer electrodes.

Although the first to fifth embodiments described above have been directed to the interline transfer solid-state imaging device having the horizontal charge transfer portion that is connected electrically to one end of the vertical charge transfer portion group, the present invention is not limited to this. For example, the present invention can be applied similarly to solid-state imaging devices of other types such as a frame transfer solid-state imaging device or a solid-state imaging device having horizontal charge transfer portions that are connected electrically to both ends of the vertical charge transfer portion group.

EXAMPLES

According to the manufacturing method illustrated by FIGS. 6 and 7, a solid-state imaging device having a structure similar to that in FIGS. 1 to 3 was produced. This solid-state imaging device was an interline transfer solid-state imaging device having a structure similar to that in FIG. 20 and had 1300×1000 pixels.

First, the P-type well layer (with an impurity concentration of $1\times10^{17}$ cm$^{-3}$) 106 and the N-type semiconductor region (with an impurity concentration of $1\times10^{16}$ cm$^{-3}$) to be the photoelectric conversion portion were formed on the surface of the N⁻⁻-type semiconductor substrate (with an impurity concentration of $1\times10^{14}$ cm$^{-3}$) 105. The N-type semiconductor region (with an impurity concentration of $1\times10^{17}$ cm$^{-3}$) 108 to be the vertical transfer channel region and the horizontal transfer channel region was formed on the surface of the P-type well layer 106. Also, the P⁺-type semiconductor region (with an impurity concentration of $1\times10^{17}$ cm$^{-3}$) 107 serving as the isolation region was formed to surround the photoelectric conversion portion, the vertical transfer channel region and the horizontal transfer channel region. Next, the insulating film 110 with a thickness of 0.1 μm including two layers of a silicon oxide film and a silicon nitride film was formed on the substrate surface by thermal oxidation and chemical vapor deposition (CVD).

Subsequently, a polycrystalline silicon film was grown on the substrate by CVD and patterned, thus obtaining the final vertical transfer electrode 113, the first vertical transfer electrode 111, the first horizontal transfer electrodes 114a and 114b. At this time, the distance ($L_{V-H}$) between the final vertical transfer electrode 113 and the first horizontal transfer electrode 114a was set to 0.5 pun, and the distance ($L_{HBA}$) between the first horizontal transfer electrodes 114a and 114b was set to 0.7 μm. Then, after the photoresist 125 was formed, the resist 125, the final vertical transfer electrode 113, the first horizontal transfer electrodes 114a and 114b were used as a mask to ion-implant boron (B), thus forming the N⁻-type semiconductor regions 109a, 109b and 109c. The impurity concentration of these N⁻-type semiconductor regions was $9\times10^{16}$ cm$^{-3}$.

Next, a silicon oxide film was formed as the interlayer insulating film 124 by thermal oxidation, and then a polycrystalline silicon film was formed by CVD and patterned, thus forming the second vertical transfer electrodes 112a and 112b, the second horizontal transfer electrodes 115a and 115b. Thereafter, a wiring and a shielding film etc. were formed, thereby obtaining a solid-state imaging device (Example 1).

Further, a solid-state imaging device having a structure similar to that in FIGS. 17 to 19 was produced in a similar manner to the above-described Example 1 except for the process of covering with the first horizontal transfer electrode 114a the entire vertical transfer channel region that extended to the region to be the connection portion 116 except the region in which the N⁻-type semiconductor region 109b was to be formed, at the time of forming the first horizontal transfer electrode (Example 2).

Figure 21:
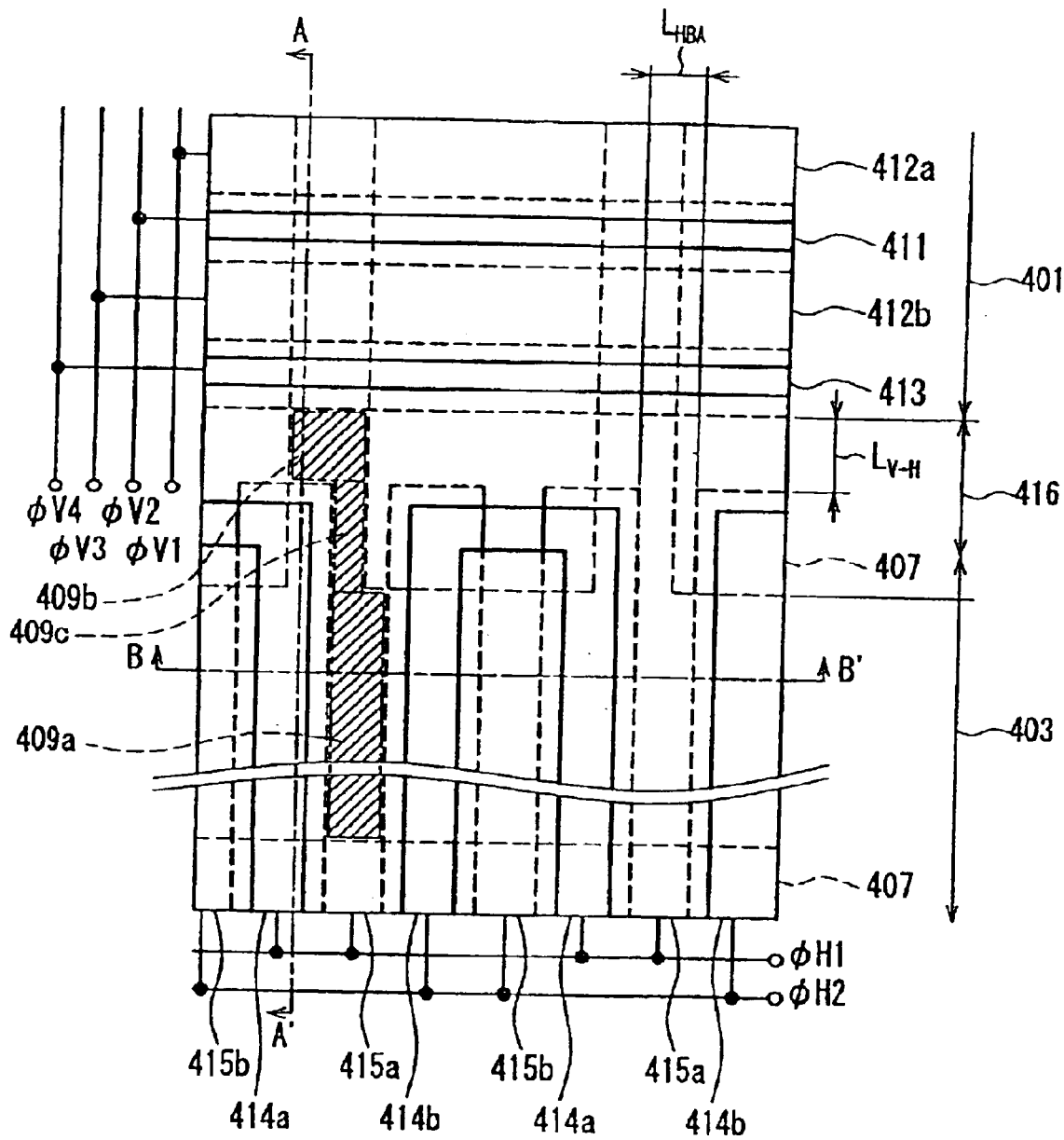
FIG. 21 is a plan view showing an example of a structure of a conventional solid-state imaging device.
Figure 22:
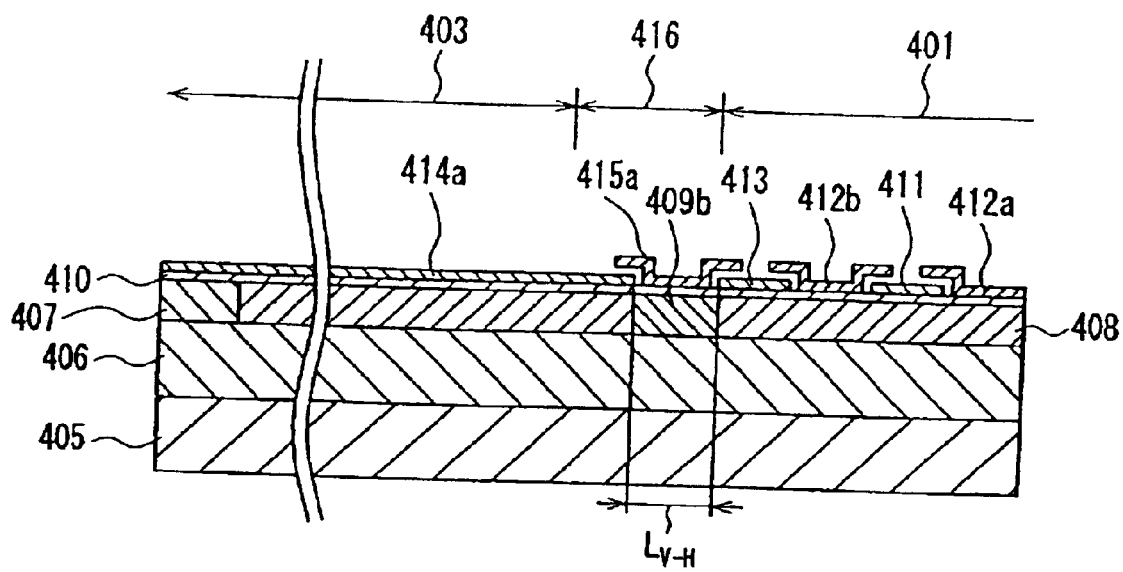
FIG. 22 is a sectional view taken along line A-A' in FIG. 21.
Figure 23:
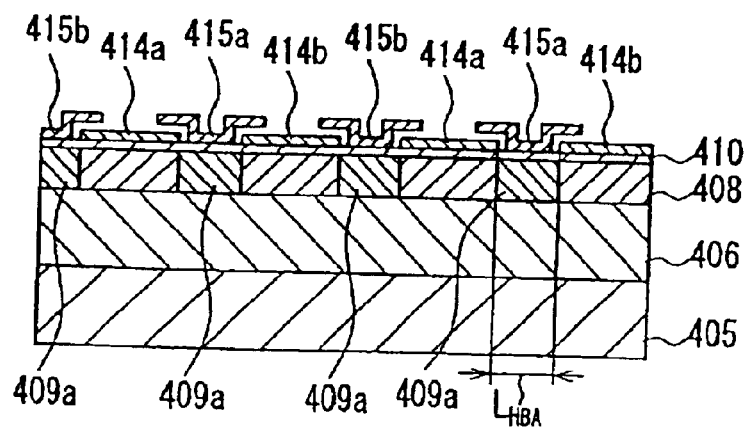
FIG. 23 is a sectional view taken along line B-B' in FIG. 21.
Figure 24:
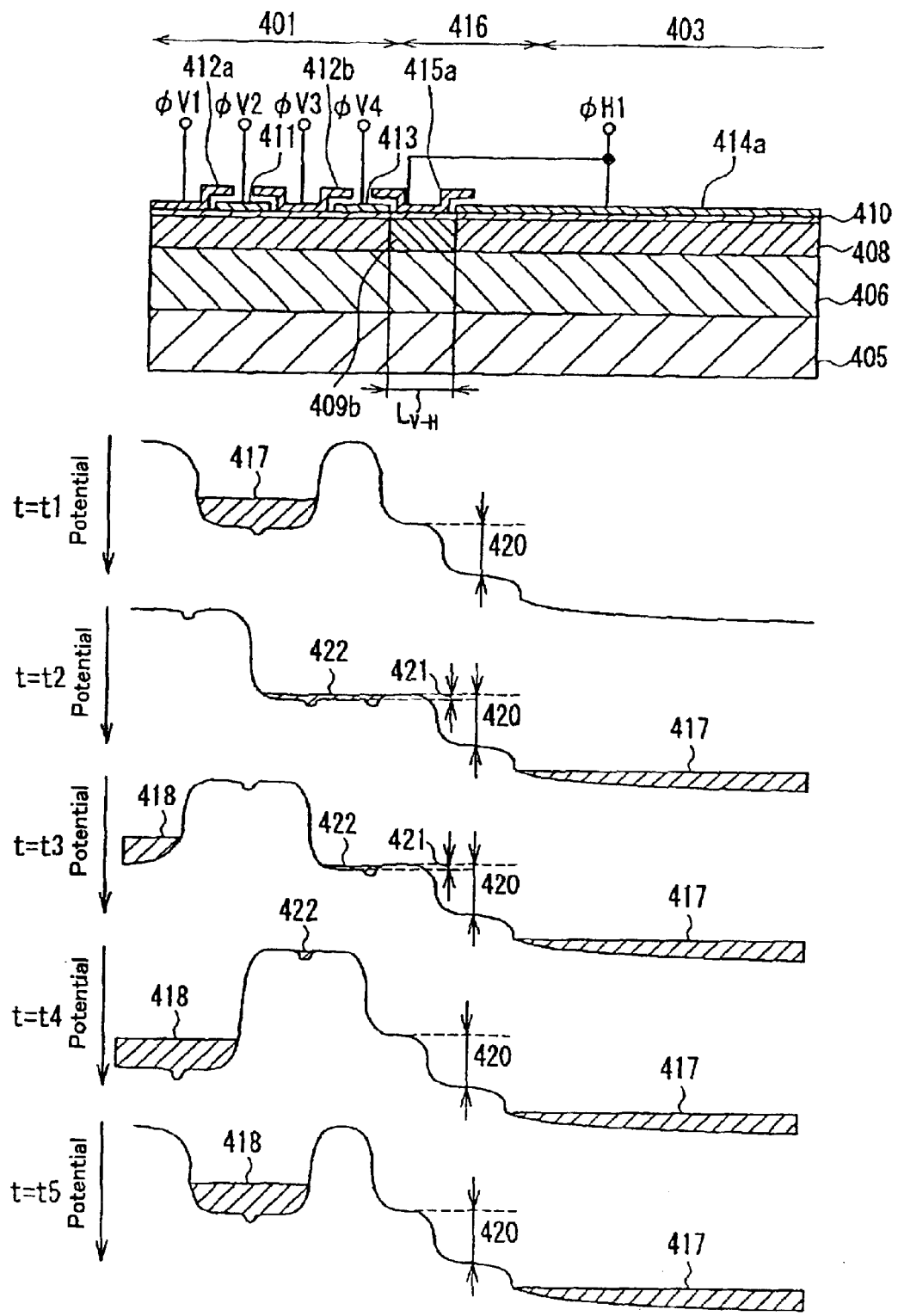
FIG. 24 shows a potential distribution in a connection portion of a vertical charge transfer portion and a horizontal charge transfer portion when the conventional solid-state imaging device is driven.
Figure 25:
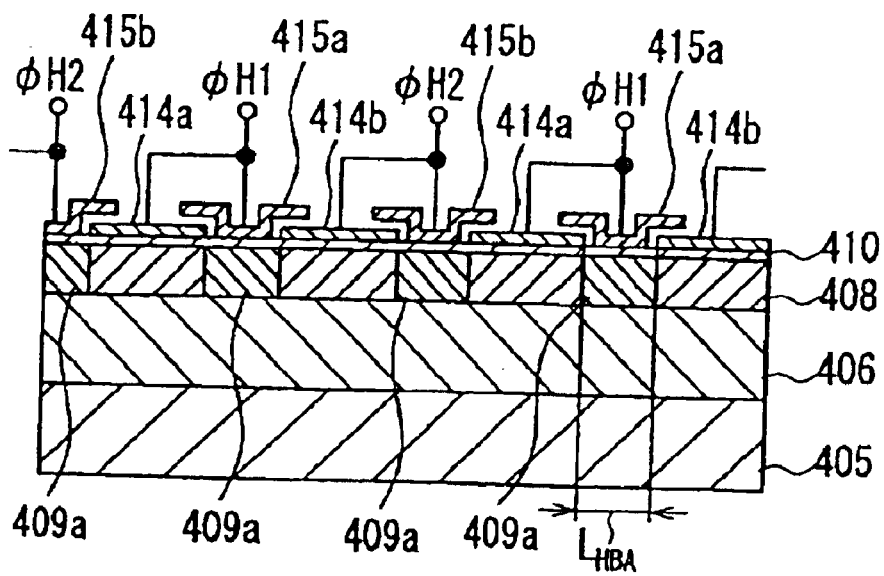
FIG. 25 shows a potential distribution in the horizontal charge transfer portion when the conventional solid-state imaging device is driven.
Figure 25:
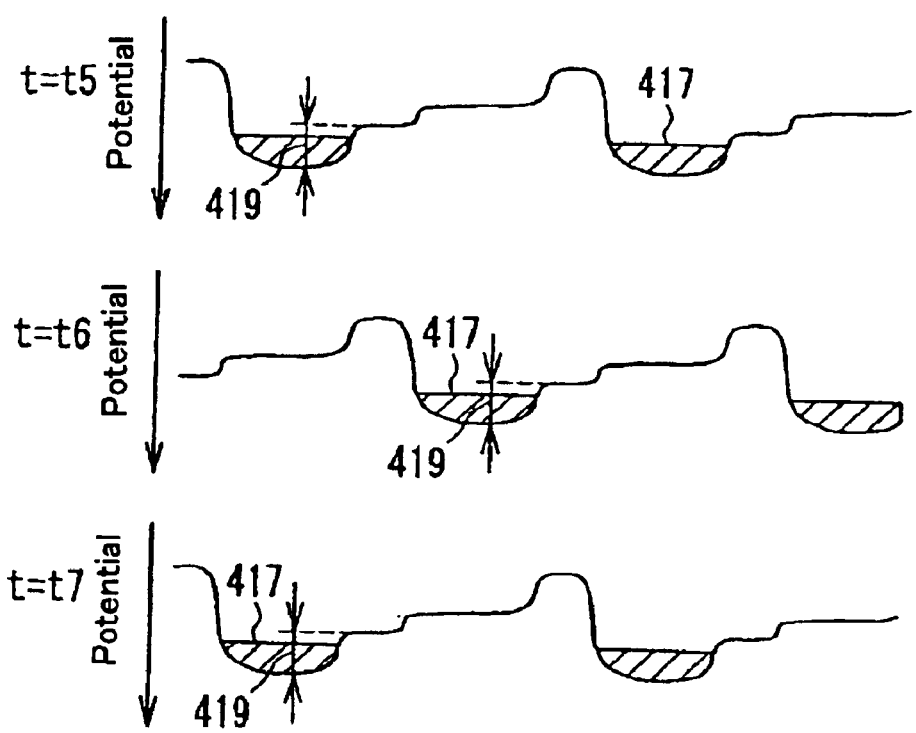

Additionally, as Comparative Example, a solid-state imaging device having a structure similar to that in FIGS. 21 to 23 was produced in a similar manner to the above-described Example 1 except that the distance ($L_{V-H}$) between the final vertical transfer electrode and the first horizontal transfer electrode was set to 0.9 μm.

Figure 27:
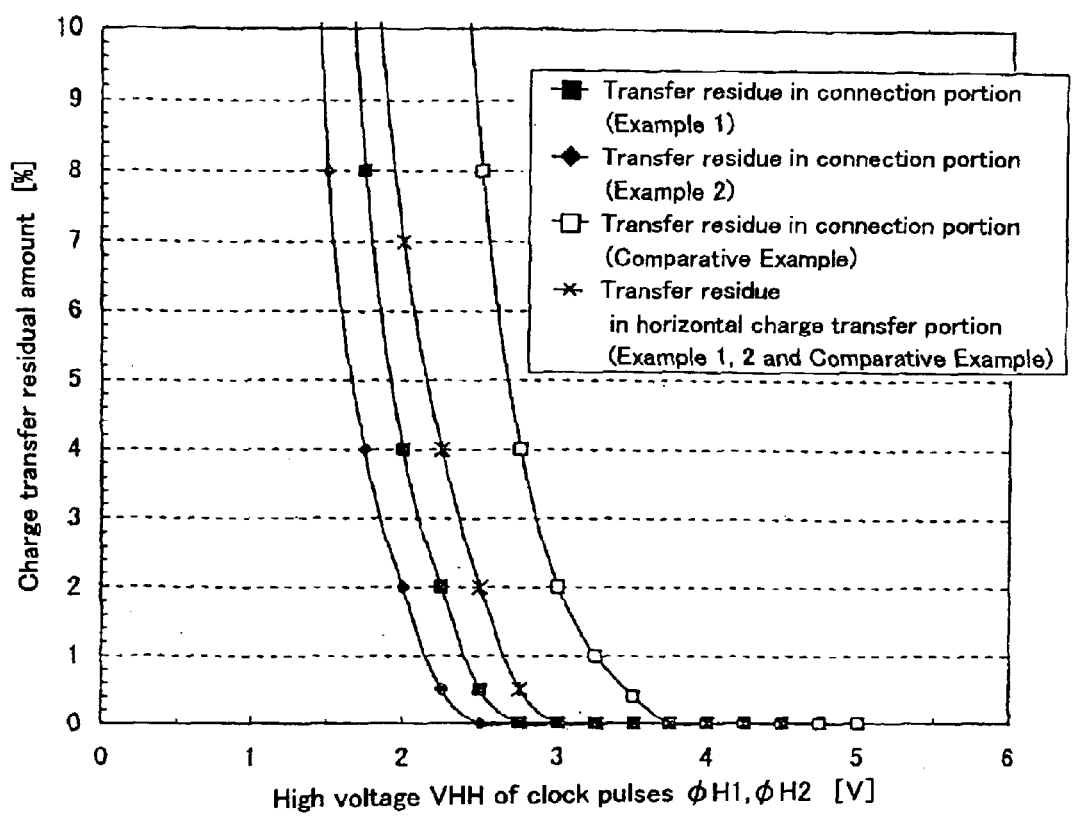
FIG. 27 is a graph showing the relationship between a drive voltage and a charge transfer residual amount in horizontal charge transfer portions in solid-state imaging devices of Examples and Comparative Example.

The solid-state imaging devices of Example 1, Example 2 and Comparative Example were driven by the clock pulses shown in FIG. 26. At this time, the high voltage $V_{HH}$ of the pulses φH1 and φH2 to be applied to the horizontal transfer electrodes were changed so as to evaluate the relationship between the high voltage $V_{HH}$ and a transfer residual amount of the signal charge. The results are shown in FIG. 27. In this evaluation, the low voltage $V_{HL}$ of the pulse to be applied to the horizontal transfer electrodes was set to 0 V, the low voltage $V_{VL}$ of the pulse to be applied to the vertical transfer electrodes was set to −8 V, and the high voltage $V_{VH}$ thereof was set to 0 V.

Figure 28:
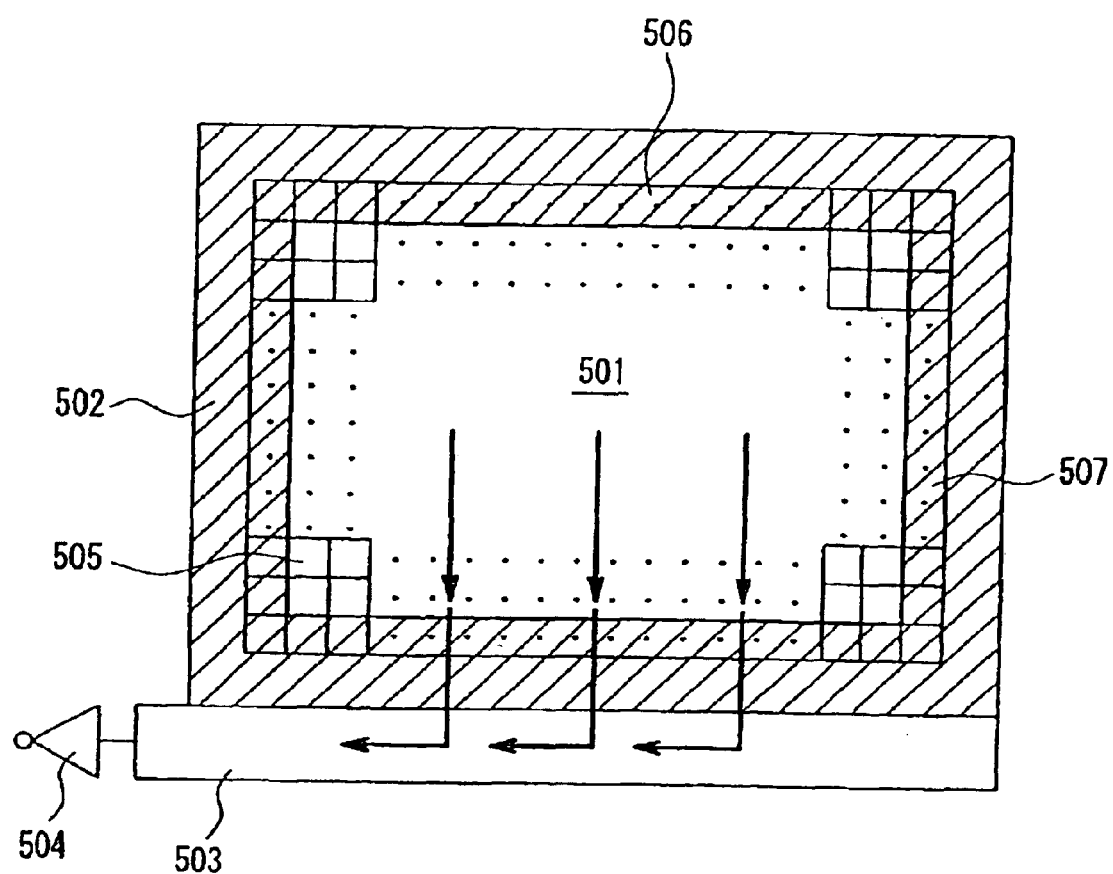
FIG. 28 is a schematic view for defining the charge transfer residual amount.

The transfer residual amount [%] is a value defined as follows. As shown in FIG. 28, in the solid-state imaging device, an optical black region 502 (a diagonally shaded area in FIG. 28) in which the photoelectric conversion portion is shielded is formed so as to surround an image region 501. Light that is adjusted to achieve an output signal of 100 mV is made to enter the entire surface of the image region 501 of this solid-state imaging device. At this time, the value obtained by dividing a signal corresponding to the first bit of an optical black region 506 on the opposite side of a horizontal charge transfer portion 503 by 100 mV serves as a transfer residual amount in the connection portion. Also, the value obtained by dividing a signal corresponding to the first bit of an optical black region 507 on the opposite side of an output circuit portion 504 by 100 mV serves as a transfer residual amount in the horizontal charge transfer portion. In FIG. 28, numeral 505 denotes a pixel, and each arrow indicates a signal charge flow.

As shown in FIG. 27, in Comparative Example, the voltage at which the transfer residue was generated in the connection portion of the vertical charge transfer portion and the horizontal charge transfer portion was higher than the voltage at which the transfer residue was generated in the horizontal charge transfer portion. Thus, as shown in FIG. 27, the high voltage $V_{HH}$ of the clock pulses φH1 and φH2 was restricted by the transfer defect in the connection portion of the vertical charge transfer portion and the horizontal charge transfer portion, making it difficult to achieve the voltage equal to or lower than 3.5 V.

In Comparative Example, the distance ($L_{V-H}$) between the final vertical transfer electrode and the first horizontal transfer electrode in the connection portion was larger than the distance ($L_{HBA}$) between the first horizontal transfer electrodes in the horizontal charge transfer portion. Thus, the short channel effect in the N⁻-type semiconductor region in the connection portion (indicated by numeral 409b in FIG. 21) was smaller than that in the N⁻-type semiconductor region in the horizontal charge transfer portion indicated by numeral 409a in FIG. 21). Consequently, it is considered that the potential in the N⁻-type semiconductor region in the connection portion of the vertical charge transfer portion and the horizontal charge transfer portion (indicated by numeral 409b in FIG. 21) was lower than that in the N⁻-type semiconductor region in the horizontal charge transfer portion (indicated by numeral 409a in FIG. 21), leading to the above-mentioned results.

In contrast, in Example 1, the voltage at which the transfer residue was generated in the connection portion of the vertical charge transfer portion and the horizontal charge transfer portion was lower than the voltage at which the transfer residue was generated in the horizontal charge transfer portion. Thus, as shown in FIG. 27, even when the high voltage $V_{HH}$ of the clock pulses φH1 and φH2 was brought down to 3.5 V or lower, display abnormalities caused by the transfer defect (for example, a vertical line display abnormality, so-called black line defect) were not generated.

In Example 1, the distance ($L_{V-H}$) between the final vertical transfer electrode and the first horizontal transfer electrode in the connection portion was smaller than the distance ($L_{HBA}$) between the first horizontal transfer electrodes in the horizontal charge transfer portion. Thus, the short channel effect in the N⁻-type semiconductor region in the connection portion (indicated by numeral 109b in FIG. 1) was greater than that in the N⁻-type semiconductor region in the horizontal charge transfer portion (indicated by numeral 109a in FIG. 1). Consequently, it is considered that the potential below the N⁻-type semiconductor region in the connection portion of the vertical charge transfer portion and the horizontal charge transfer portion (indicated by numeral 109b in FIG. 1) was higher than that below the N⁻-type semiconductor region in the horizontal charge transfer portion (indicated by numeral 109a in FIG. 1), leading to the above-mentioned results.

In Example 2, similarly to Example 1, the voltage at which the transfer residue was generated in the connection portion of the vertical charge transfer portion and the horizontal charge transfer portion was lower than the voltage at which the transfer residue was generated in the horizontal charge transfer portion, and thus, even when the high voltage $V_{HH}$ of the clock pulses φH1 and φH2 was brought down to 3.5 V or lower, display abnormalities caused by the transfer defect (for example, a vertical line display abnormality, so-called black line defect) were not generated. Furthermore, Example 2 enabled the formation of a still lower potential barrier of the connection portion of the vertical charge transfer portion and the horizontal charge transfer portion compared with that in Example 1. Therefore, it was possible to achieve a still lower high voltage $V_{HH}$ of the clock pulses φH1 and φH2 while suppressing sufficiently display abnormalities caused by the transfer defect.

Although the above description has illustrated several examples of the present invention, the present invention is by no means limited to these examples. In other words, the scope of the present invention is limited only by the appended claims.

What is claimed is:

1. A solid-state imaging device comprising:
   a vertical charge transfer portion comprising
      a vertical transfer channel region, and
      a plurality of vertical transfer electrodes formed on the vertical transfer channel region; and
   a horizontal charge transfer portion that is connected to at least one end of the vertical charge transfer portion and receives a charge transferred from the vertical charge transfer portion and then transfers the charge, the horizontal charge transfer portion comprising
      a horizontal transfer channel region,
      a plurality of first horizontal transfer electrodes formed on the horizontal transfer channel region, and
      a plurality of second horizontal transfer electrodes arranged between the plurality of first horizontal transfer electrodes;
   wherein a potential below the first horizontal transfer electrode is higher than a potential below the second horizontal transfer electrode that is arranged adjacent to the first horizontal transfer electrode and backward along a transfer direction with respect to the first horizontal transfer electrode,
   in a connection portion of the vertical charge transfer portion and the horizontal charge transfer portion, a final vertical transfer electrode arranged at a terminating end of the vertical charge transfer portion and the first horizontal transfer electrode in the horizontal charge transfer portion are arranged so as to have a space therebetween where the second horizontal transfer electrode is arranged, and
   a distance between the final vertical transfer electrode and the first horizontal transfer electrode in the connection portion is equal to or smaller than a distance between the first horizontal transfer electrodes in the horizontal charge transfer portion.

2. The solid-state imaging device according to claim 1, wherein the distance between the final vertical transfer electrode and the first horizontal transfer electrode ranges from 50% to 100% of the distance between the first horizontal transfer electrodes in the horizontal charge transfer portion.

3. The solid-state imaging device according to claim 1, wherein the distance between the final vertical transfer electrode and the first horizontal transfer electrode and the distance between the first horizontal transfer electrodes in the horizontal charge transfer portion range from 0.2 to 3 μm, respectively.

4. The solid-state imaging device according to claim 1, wherein a first potential barrier region is formed between the final vertical transfer electrode and the first horizontal transfer electrode in the connection portion, and a second potential barrier region is formed between the first horizontal transfer electrodes in the horizontal charge transfer portion.

5. The solid-state imaging device according to claim 4, wherein the first potential barrier region and the second potential barrier region are formed by setting different impurity concentrations in a region below the first horizontal transfer electrode and a region below the second horizontal transfer electrode.

6. The solid-state imaging device according to claim 5, wherein a vertical dimension of the first potential barrier region is smaller than the distance between the final vertical transfer electrode and the first horizontal transfer electrode.

7. The solid-state imaging device according to claim 6, wherein the vertical dimension of the first potential barrier region ranges from 50% to 100% of the distance between the final vertical transfer electrode and the first horizontal transfer electrode.

8. The solid-state imaging device according to claim 4, wherein the first potential barrier region and the second potential barrier region are formed by applying different voltages to the first horizontal transfer electrode and the second horizontal transfer electrode.

9. The solid-state imaging device according to claim 4, wherein the second potential barrier region is formed so as not to overlap the vertical transfer channel region.

10. A method for manufacturing a solid-state imaging device comprising a vertical charge transfer portion and a horizontal charge transfer portion that is connected to at least one end of the vertical charge transfer portion and receives a charge transferred from the vertical charge transfer portion and then transfers the charge, the method comprising:

forming a vertical transfer channel region and a horizontal transfer channel region in a semiconductor substrate;

forming a plurality of first vertical transfer electrodes and a final vertical transfer electrode arranged at a terminating end of the vertical charge transfer portion on the vertical transfer channel region, and forming a plurality of first horizontal transfer electrodes on the horizontal transfer channel region; and forming a plurality of second vertical transfer electrodes on the vertical transfer channel region so as to be arranged between the plurality of first vertical transfer electrodes, thus forming the vertical charge transfer portion, and forming a plurality of second horizontal transfer electrodes on the horizontal transfer channel region so as to be arranged between the plurality of first horizontal transfer electrodes, thus forming the horizontal charge transfer portion;

wherein in a region to be a connection portion of the vertical charge transfer portion and the horizontal charge transfer portion, the final vertical transfer electrode and the first horizontal transfer electrode are formed so as to be spaced away from each other, and the second horizontal transfer electrode is formed so that a part of the second horizontal transfer electrode is arranged between the final vertical transfer electrode and the first horizontal transfer electrode, and a distance between the final vertical transfer electrode and the first horizontal transfer electrode in the region to be the connection portion is made equal to or smaller than a distance between the first horizontal transfer electrodes in the horizontal charge transfer portion.

11. The method for manufacturing a solid-state imaging device according to claim 10, wherein the distance between the final vertical transfer electrode and the first horizontal transfer electrode ranges from 50% to 100% of the distance between the first horizontal transfer electrodes in the horizontal charge transfer portion.

12. The method for manufacturing a solid-state imaging device according to claim 10, wherein the distance between the final vertical transfer electrode and the first horizontal transfer electrode and the distance between the first horizontal transfer electrodes in the horizontal charge transfer portion range from 0.2 to 3 μm, respectively.

13. The method for manufacturing a solid-state imaging device according to claim 10, further comprising forming a first potential barrier region in a space between the final vertical transfer electrode and the first horizontal transfer electrode and a second potential barrier region in a space between the first horizontal transfer electrodes, by using the final vertical transfer electrode and the first horizontal transfer electrodes as a mask for an ion-implantation of an impurity that has an electrical conductivity opposite to the vertical transfer channel region and the horizontal transfer channel region.

14. The method for manufacturing a solid-state imaging device according to claim 13, wherein in the forming process of the first potential barrier region and the second potential barrier region, an ion-implantation direction of the impurity is inclined toward a transfer direction in the vertical charge transfer portion or a direction opposite to the transfer direction with respect to a surface of the semiconductor substrate.

15. The method for manufacturing a solid-state imaging device according to claim 14, wherein in the forming process of the first potential barrier region and the second potential barrier region, the ion-implantation direction of the impurity is inclined by 5° to 45° from a normal line of the semiconductor substrate.

16. The method for manufacturing a solid-state imaging device according to claim 13, wherein the second potential barrier region is formed so as not to overlap the vertical transfer channel region.

* * * * *